(12) United States Patent
Matsuyama

(10) Patent No.: US 7,718,944 B2
(45) Date of Patent: May 18, 2010

(54) SOLID-STATE IMAGE SENSING DEVICE AND METHOD OF OPERATING THE SAME

(75) Inventor: Eiji Matsuyama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 496 days.

(21) Appl. No.: 11/727,757

(22) Filed: Mar. 28, 2007

(65) Prior Publication Data
US 2007/0229690 A1 Oct. 4, 2007

(30) Foreign Application Priority Data
Mar. 28, 2006 (JP) ............................. 2006-089450

(51) Int. Cl.
H01L 27/00 (2006.01)
H01J 40/14 (2006.01)
H04N 3/14 (2006.01)

(52) U.S. Cl. ............................. 250/208.1; 250/214 R; 348/322

(58) Field of Classification Search .............. 250/208.1, 250/214 R, 214.1, 216; 257/346, 184, 187, 257/222, 231, 236, 239, 241–251, 258; 348/309–316, 348/320–322
See application file for complete search history.

(56) References Cited

U.S. PATENT DOCUMENTS

| 5,204,989 A | * | 4/1993 | Yamamoto | ................... 257/221 |
| 5,990,503 A | * | 11/1999 | Ingram et al. | ................ 257/236 |
| 6,452,634 B1 | * | 9/2002 | Ishigami et al. | .............. 348/322 |
| 7,336,757 B2 | * | 2/2008 | Yoshimura et al. | ............ 377/63 |

FOREIGN PATENT DOCUMENTS

JP 2001-068660 3/2001

* cited by examiner

*Primary Examiner*—Georgia Y Epps
*Assistant Examiner*—Don Williams
(74) *Attorney, Agent, or Firm*—Young & Thompson

(57) ABSTRACT

A charge coupled device is provided with: an output gate; a main CCD region operated in response to a set of clock signals; and an output region positioned between the output gate and the main CCD region and designed to transfer electric charges received from the main CCD region to the output gate. The main CCD region includes first and second transfer electrodes. The output region includes third and fourth transfer electrodes receiving clock signals which are phase-reversed from each other. The set of clock signals received by the main CCD region and the clock signals received by the output region are outputted from different driver circuits.

20 Claims, 24 Drawing Sheets

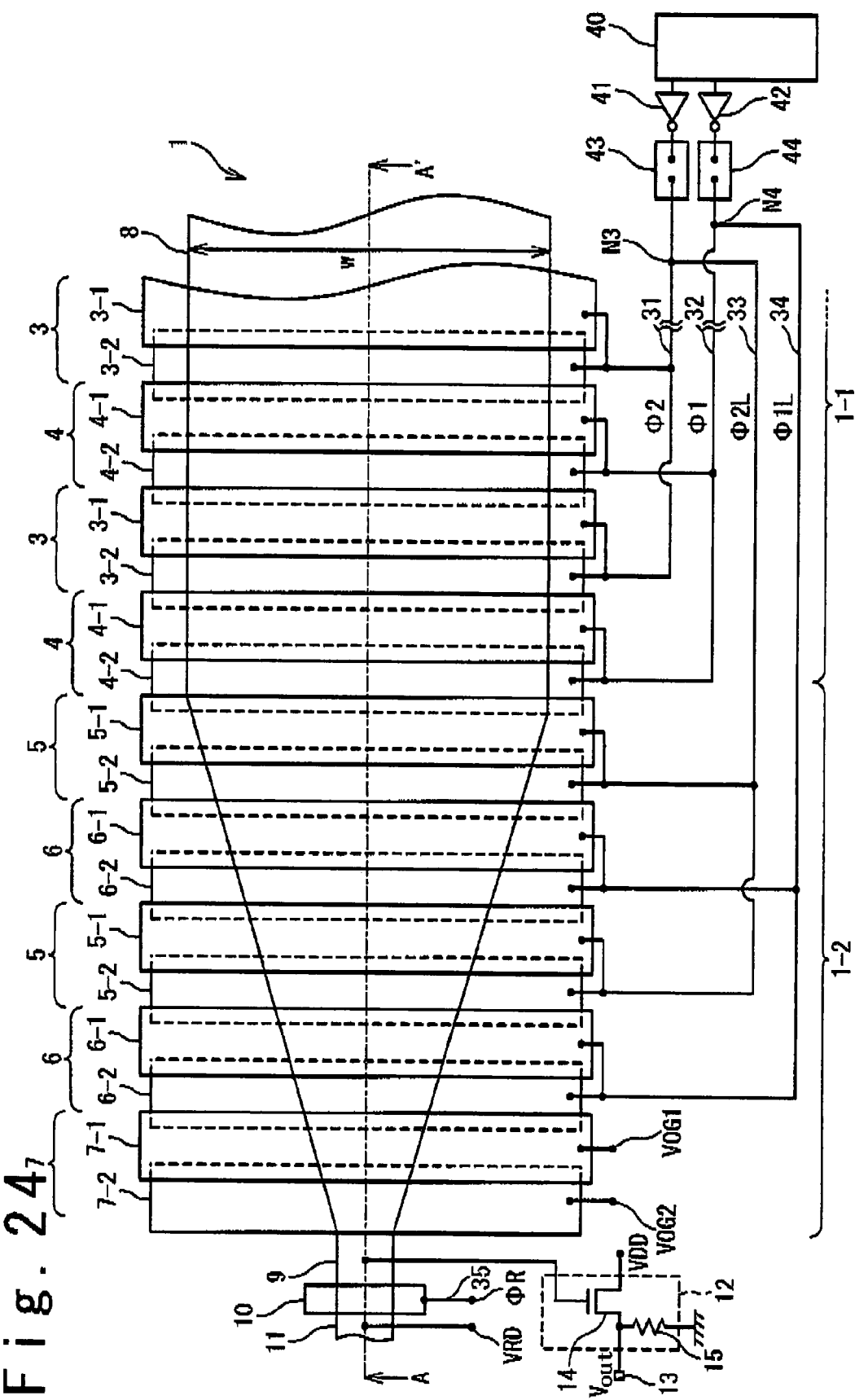

# SOLID-STATE IMAGE SENSING DEVICE AND METHOD OF OPERATING THE SAME

BACKGROUND OF THE INVENTION

1. Field of the Invention

The present invention relates to a solid-state image sensing device, more particularly, to a solid-state image sensing device that incorporates a CCD (charge coupled device).

2. Description of the Related Art

The advance of the semiconductor technology enhances the use of solid-state image sensing devices, which receive light on the light receiving surface from a target body through an optical system typically including a lens and so forth, and photoelectrically convert the intensity of the received light into the corresponding amounts of electric charges to thereby generate electrical signals. A commercially-used solid-state image sensing device usually includes a CCD (charge coupled device). The advance in the fine processing technology of the semiconductor device allows manufacturing a solid-state image sensing device with an increased pixel density, that is, with an improved fineness.

When the solid-state image sensing device converts an image into an electric signal, the CCD is used to transfer electric charges received from light sensitive devices to a circuit that generates the electric signal in response to the amount of the electric charges.

A typical CCD within a solid-state image sensing device is designed to transfer electric charges from light sensitive devices in response to a set of clock signals received from a clock generator circuit. In general, a solid-state image sensing devices uses a pair of clock signals (which may denoted by Φ1 and Φ2, hereinafter) for operating a horizontal CCD that transfers electric charges horizontally, as disclosed in Japanese Laid-Open Patent Application No. 2001-68660.

FIG. 1 discloses the structure of the solid-state image sensing device disclosed in this application. The disclosed solid-state image sensing device incorporates a CCD, denoted by the numeral 100, which is provided with: a plurality of charge transfer electrode pairs 110; first and second clock signal lines 101 and 102 feeding first and second clock signals Φ1 and Φ2, respectively, to the charge transfer electrode pairs 110; an output stage electrode pair 113, a third clock signal line feeding a third clock signal Φ1L to the output stage electrode pair 113; a pair of output gates 104; a floating diffusion 105; an output circuit 106; and a reset gate 107. It should be noted that the charge transfer electrode pairs 110 each consist of first and second polysilicon electrodes 111 and 112. In the CCD 100, the charge transfer electrode pairs 110 receiving the first clock signal Φ1 and the charge transfer electrode pairs 110 receiving the first clock signal Φ2 are alternately arranged.

The floating diffusion 105 is a diffusion layer used for charge detection. Signal charges transferred over an N-well are transferred to the floating diffusion 105 through the output gates 104. The output gates 104 receive a pair of fixed output gate voltages (VOG1 and VOG2), respectively, as described later. The reset gate 107 is used to periodically reset the voltage level of the floating diffusion 105; the reset gate 107 resets the voltage level of the floating diffusion 105 to the voltage level of the reset drain in response to a reset pulse signal ΦR. The output circuit 106 generates an output signal in response to the voltage level of the floating diffusion 105. As shown in FIG. 1, the output stage electrode pair 113 is positioned at the final stage of the charge transfer device transferring the electric charges to the floating diffusion 105 within the CCD 100. The output stage electrode pair 113 forwards the electric charges transferred thereto to the output gates 104 in response to third clock signal Φ1L.

FIG. 2 is a sectional view illustrating a structure of the CCD 100 on the C-C' section of FIG. 1. The CCD 100 is provided with a P-well formed within an n-type semiconductor substrate and an N-well formed on the P-well. The N-well is used to accumulate and transfer electric charges. Storage regions (or non-barriered regions) are positioned under the first polysilicon electrodes 111 across gate dielectrics, and barrier regions are formed under the second polysilicon electrodes 112 across gate dielectrics through ion implantation of p-type impurities (such as boron ions) to provides voltage level differences within the transfer channel under the same charge transfer electrode pair 110. The floating diffusion 105, which is used for charge detection, incorporates a pn junction between the P-well and the N-well, positioned between the output gates 104 and the reset gate 107.

As described above, the output stage electrode pair 113 receives the third clock signal Φ1L. One of the output gates 104 (which is referred to as the first output gate electrode, hereinafter) receives the first output gate voltage VOG1, while the other of the output gates 104 (which is referred to as the second output gate electrode, hereinafter) receives the second output gate voltage VOG2. The reset gate 107 receives the reset pulse signal ΦR, and the reset drain 108 is biased to a reset drain voltage level VRD. It should be noted that the first output gate voltage VOG1, the second output gate voltage VOG2, and the reset drain voltage level VRD are fixed voltages levels.

FIG. 3 is a timing chart illustrating waveforms of signals fed to the CCD 100. The first to third clock signals Φ1, Φ2 and Φ1L and the reset pulse signal ΦR are voltage signals with signal levels changing on the time scale. FIGS. 3(a) to 3(d) illustrate the waveforms of first, second, third clock signals Φ1, Φ2 and Φ1L and the reset pulse signal ΦR, respectively. The "high" and "low" levels of the first clock signal Φ1 are denoted in FIG. 3(a) as "V1H", "V1L", respectively, and the "high" and "low" levels of the second clock signal Φ2 are denoted in FIG. 3(b) as "V2H", "V2L", respectively. Correspondingly, the "high" and "low" levels of the third clock signal Φ1L are denoted in FIG. 3(c) as "V3H", "V3L", respectively, and the "high" and "low" levels of the reset pulse signal ΦR are denoted in FIG. 3(d) as "V4H", "V4L", respectively. In the time period from the time t1 to t4, as shown in FIG. 3(a), the first clock signal Φ1 is pulled down from the voltage level V1H to the voltage level V1L, and then pulled up to the voltage level V1H. In the meantime, the second clock signal Φ2 is pulled up from the voltage level V2L to the voltage level V2H, and then pulled down to the voltage level V2L, while the third clock signal Φ1L is pulled down from the voltage level V3H to the voltage level V3L, and then pulled up to the voltage level V3H. The reset pulse signal ΦR is pulled up at the time t3.

FIG. 4 illustrates the charge transfer in the time period from the time t1 to t4. FIG. 4(a) illustrates the state of electric charges accumulated in the N-well at the time t1, while FIG. 4(b) illustrates the state of electric charges at the time t2. Correspondingly, FIG. 4(c) illustrates the state of electric charges accumulated in the N-well at the time t3, while FIG. 4(d) illustrates the state of electric charges at the time t4.

At the time t1, signal charges Q1 are accumulated in the storage region under the output stage electrode pair 113. The signal charges Q1 are injected into the floating diffusion 105 at the time t2, after passing through under the output gates 104. The signal charges Q1 are detected as a voltage at the time t2, and then drained outside through the reset drain 108 at the time t3, due to the pull-up of the reset pulse signal ΦR applied to the reset gate 107. At the time t3, next signal charges Q2 are accumulated in the storage region under the output stage electrode pair 113.

This is followed by pulling down the reset pulse signal ΦR to the voltage level VRL at time t4 to return the state of the time t1. Repeating such operation allows sequentially detecting signal charges Q1, Q2, Q3 . . . as the corresponding output voltages.

The inventor has now discovered that an issue of the conventional CCD 100 is that some of the signal charges may remain untransferred. FIG. 5 illustrates the manner in which signal charges remain untransformed. In the conventional CCD 100, the charge transfer electrodes pairs 110 are provided with the first and second clock signals Φ1 and Φ2. Additionally, several charge transfer electrodes pairs 110 adjacent to the output stage electrode pair 113 often have longer electrode lengths than those of other transfer electrodes pairs 110 away from the output stage electrode pair 113. In such a case, the duration of the time necessary for transferring signal charges through the several charge transfer electrodes pairs 110 adjacent to the output stage electrode pair 113 is longer than that necessary for transferring signal charges through other charge transfer electrodes pairs 110 away from the output stage electrode pair 113. Additionally, the increase in the electrode length may causes reduction of the fringing field effect of the output gates 104; it should be noted that the fringing field effect is an effect of the disorder of the electric field at the edge of an electrode. This may cause untransferred signal charges, denoted by the symbol ΔQ2 in FIG. 5(b).

Additionally, the conventional CCD 100 may suffer from coupling noise on the output thereof. FIG. 6 is a timing chart illustrating the waveforms of the clock signals and the output voltage. During the time period from the time t4 to the time t6, the first clock signal Φ1 is pulled down, and the second clock signal Φ2 is pulled down. In the meantime, the third clock signal Φ1L is pulled down during the time period from the time t4 to the time t5.

The load capacitances of the first and second clock signal lines 101 and 102, connected with the repeatedly-arranged charge transfer electrode pairs 110 (See FIG. 2), are usually in the order of several hundreds picofarads, while the load capacitance of the third clock signal line 103, connected with the output stage electrode pair 113, is usually in the order of several tens picofarads or less. Therefore, the CR time constant in the transfer of the third clock signal Φ1L is largely smaller than that in the transfer of the first and second clock signals Φ1 and Φ2. Therefore, the edges of the clock signals Φ1 and Φ2 are duller than that of the clock signal Φ1L.

As a result, the clock signal Φ1L is pulled down more rapidly in the time period from the time t4 to the time t5, while the clock signals Φ1 and Φ2 are switched more slowly in the time period from the time t4 to the time t6. This undesirably causes coupling noise applied to the floating diffusion 105 from the output stage electrode pair 113 fed with the third clock signal Φ1L, resulting in that the output voltage suffers from the coupling noise as shown in FIG. 6(d). The coupling noise caused by the third clock signal Φ1L undesirably reduces the allowed signal transfer period, and may result in the shortage of the signal stabilization period, especially when the CCD 110 is operated at a high operation speed.

SUMMARY

In one embodiment, a charge coupled device is provided with: an output gate; a main CCD region operated in response to a set of clock signals; and an output region positioned between the output gate and the main CCD region and designed to transfer electric charges received from the main CCD region to the output gate. The main CCD region includes first and second transfer electrodes. The output region includes third and fourth transfer electrodes receiving clock signals which are phase-reversed from each other. The set of clock signals received by the main CCD region and the clock signals received by the output region are outputted from different driver circuits.

Such architecture allows a trailing edge of the clock signals fed to the output region is sharper than a trailing edge of the clock signals fed to the main CCD region.

In another embodiment, the clock signals fed to the third and fourth transfer electrodes have symmetric waveforms with respect to the voltage, resulting in that the duration of the pull-up of the clock signal fed to the third transfer electrode is identical to the pull-down of the clock signal fed to the fourth transfer electrode, for example. This allows the clock signals fed to the third and fourth transfer electrodes to mutually cancel the coupling effects on the output of the charge coupling device.

The present invention effectively reduces the coupling noise of the output voltage of a charge coupling device. Additionally, the present invention effectively reduces the charge transfer error in a high-speed operation of the charge coupling device.

BRIEF DESCRIPTION OF THE DRAWINGS

The above and other advantages and features of the present invention will be more apparent from the following description taken in conjunction with the accompanied drawings, in which:

FIG. 24 is a plan view illustrating the structure of a solid-state image sensing device in a fifth embodiment of the present invention.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed. In the following, a description is given for an example in which a solid-state image sensing device includes an ion-implantation barrier type two-phase CCD.

First Embodiment

Figure 1:
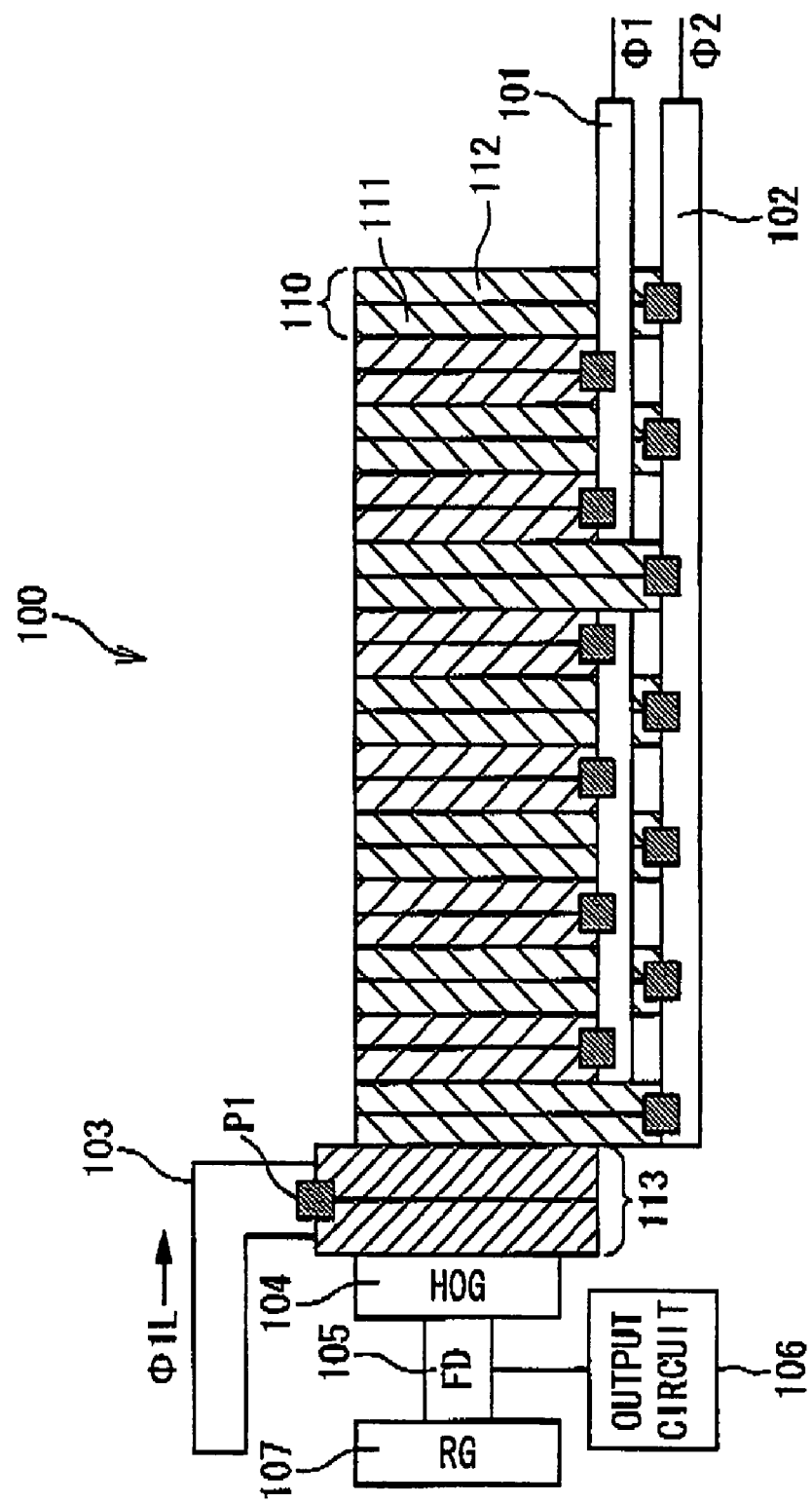
FIG. 1 is a plan view illustrating the structure of a conventional CCD.
Figure 2:
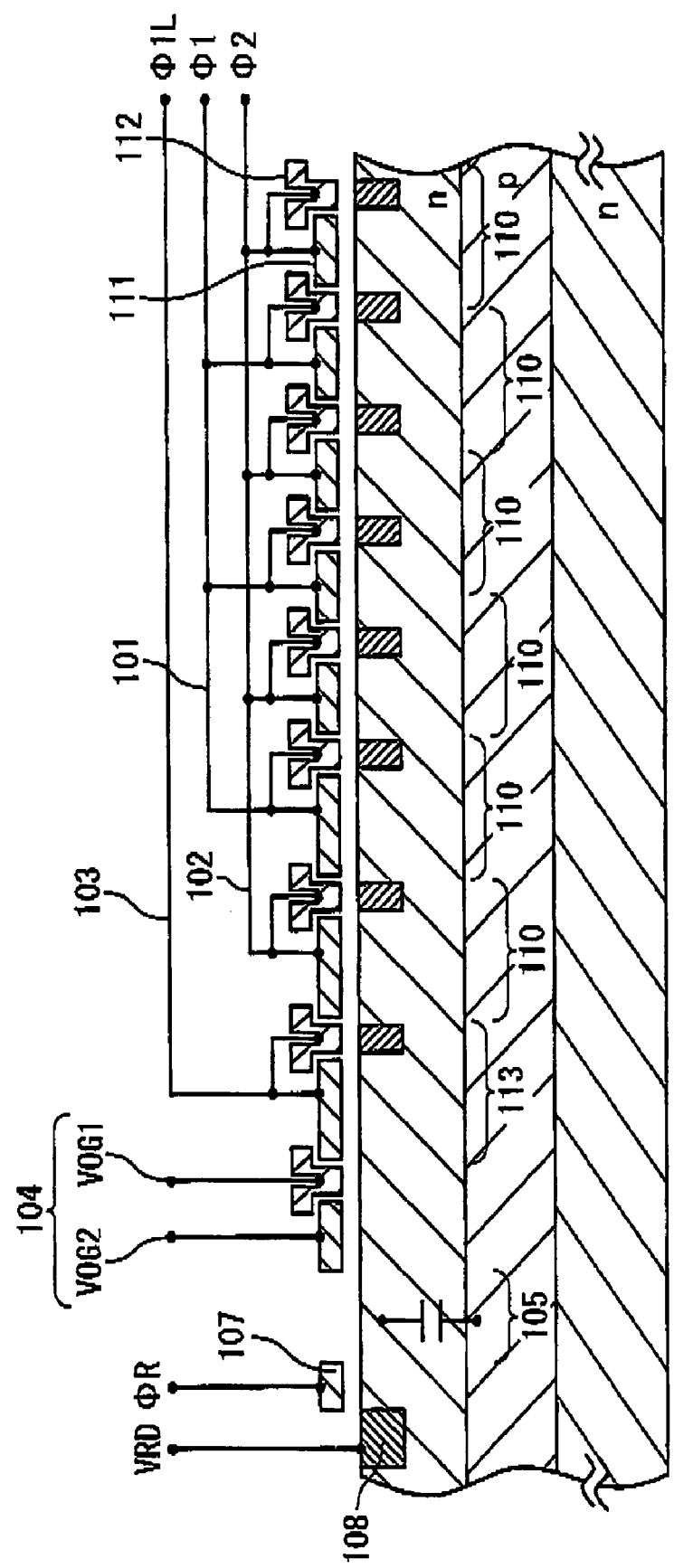
FIG. 2 is a section view illustrating the structure of the conventional CCD shown in FIG. 1.
Figure 3:
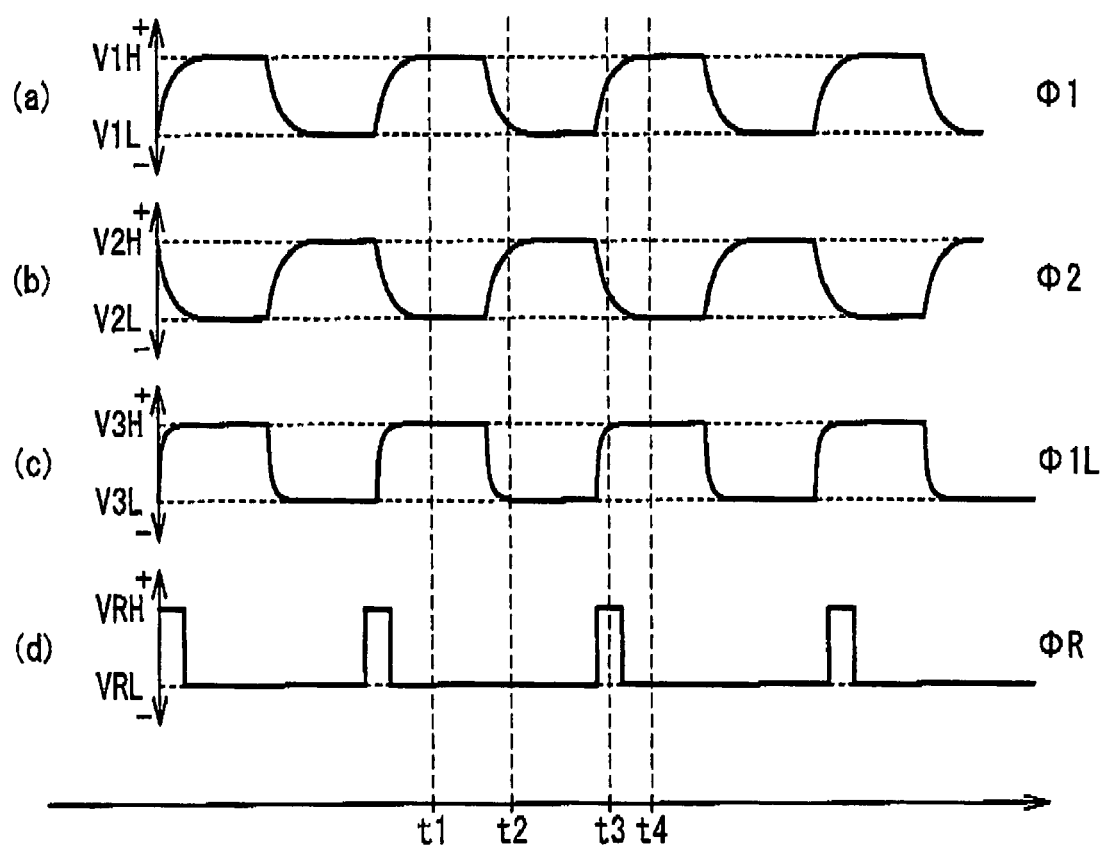
FIG. 3 is a timing chart illustrating the operation of the conventional CCD shown in FIG. 1.
Figure 4:
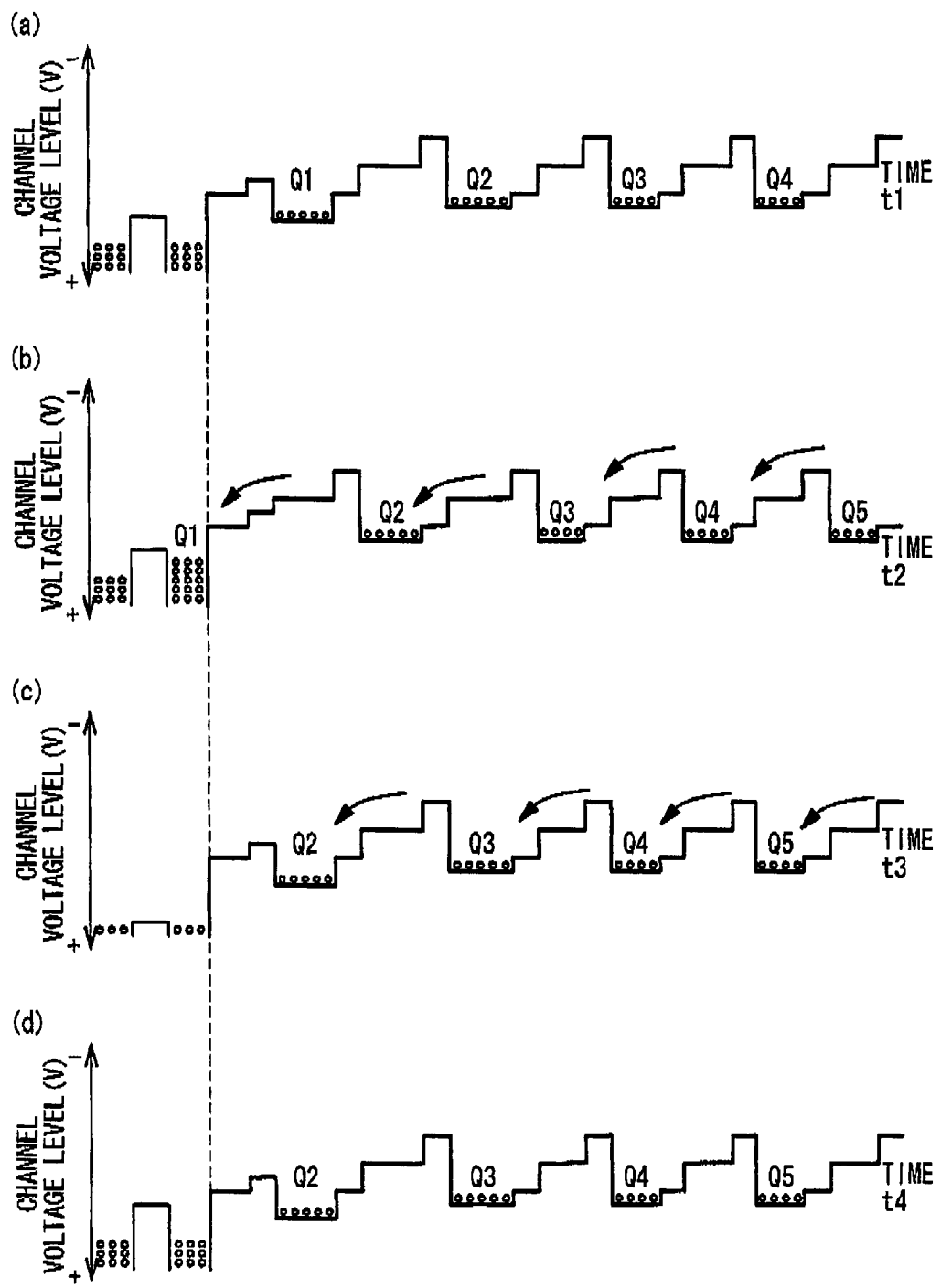
FIG. 4 is a schematic diagram illustrating the potential profile across the convention CCD shown in FIG. 1.
Figure 5:
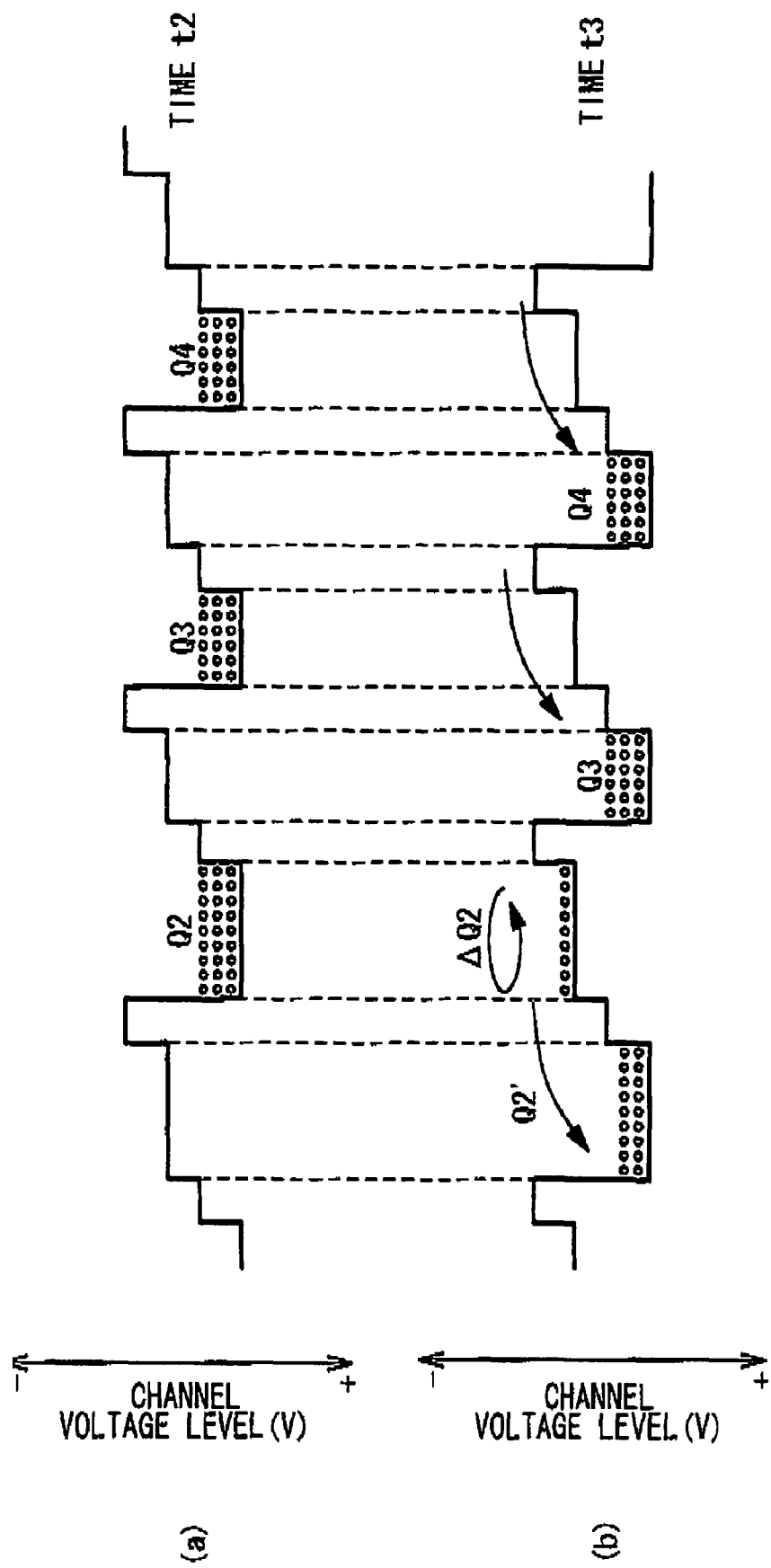
FIG. 5 is a schematic diagram explaining the existence of untransferred signal charges.
Figure 6:
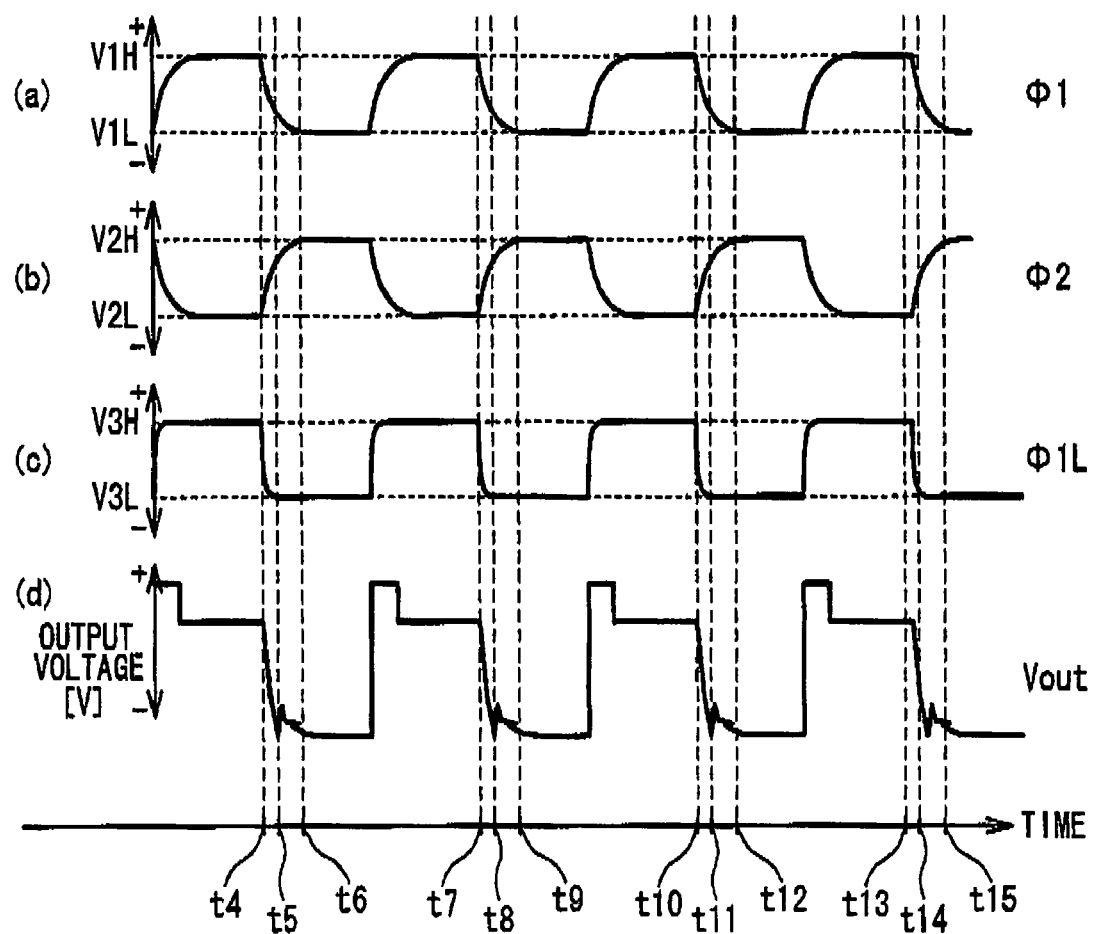
FIG. 6 is a timing chart illustrating the waveform of the output voltage of the conventional CCD.
Figure 7:
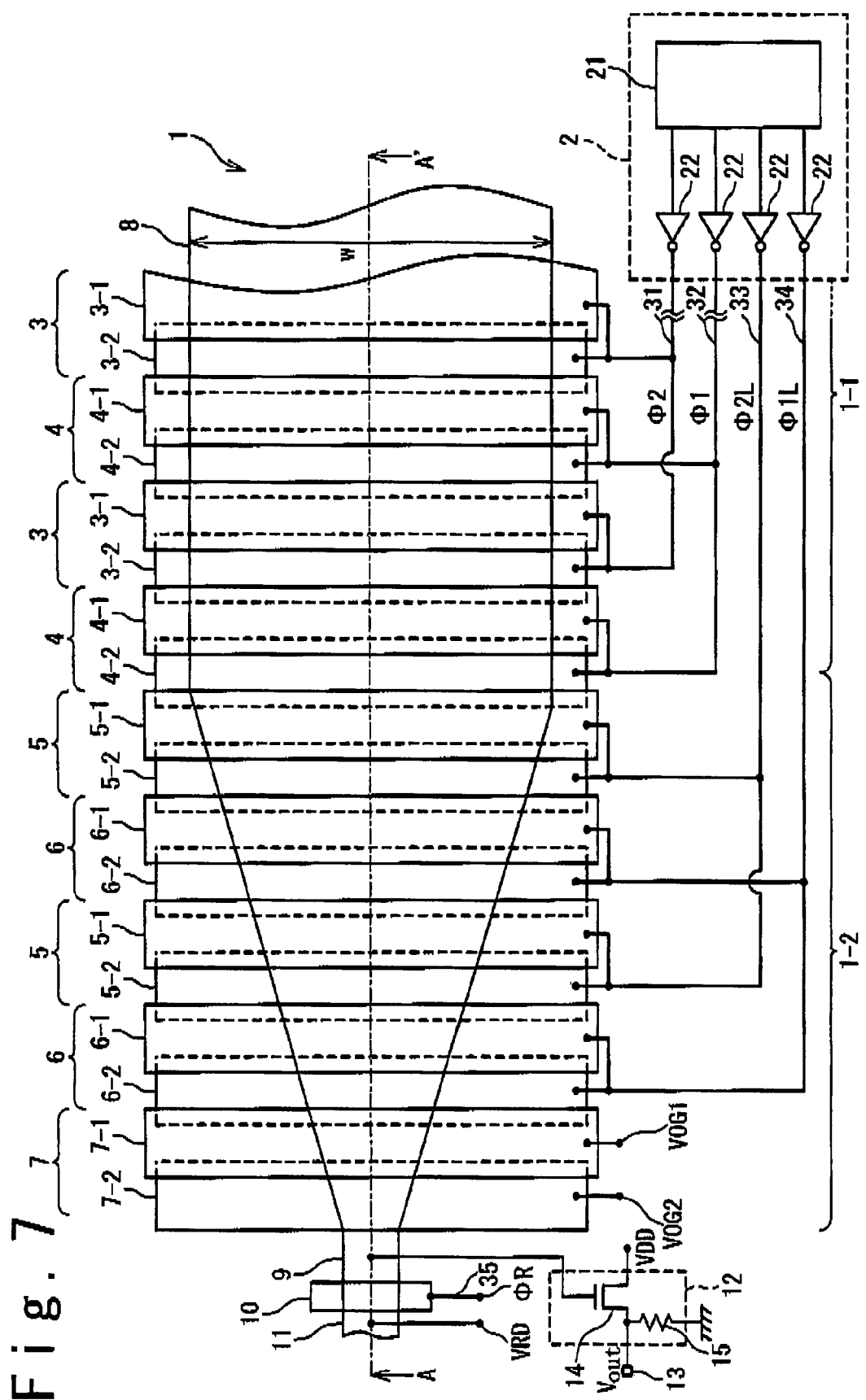
FIG. 7 is a plan view illustrating the structure of a solid-state image sensing device in a first embodiment of the present invention.

FIG. 7 is a plan view illustrating the structure of a solid-state image sensing device in a first embodiment of the present invention. The solid-state image sensing device in the first embodiment is provided with a CCD (charge coupling device) 1 for transferring electric charges, and a clock generator 2 feeding a set of clock signals to the CCD 1. The CCD 1 includes first transfer electrode pairs 4, second transfer electrode pairs 3, third transfer electrode pairs 6, fourth transfer electrode pairs 5, an output gate 7, a floating diode 9, a reset gate 10, and a reset drain 11. The first transfer electrode pairs 4 commonly receive a first clock signal $\Phi 1$, and the second transfer electrode pairs 3 commonly receive a second clock signal $\Phi 2$. The third transfer electrode pairs 6 commonly receive a third clock signal $\Phi 1L$, and the fourth transfer electrode pairs 5 commonly receive a second clock signal $\Phi 2L$. The first and third clock signals $\Phi 1$ and $\Phi 1L$ have the same phase, and the second and fourth clock signals $\Phi 2$ and $\Phi 2L$ have the same phase. The second and fourth clock signals $\Phi 2$ and $\Phi 2L$ are reversed from the phase of the first and third clock signals $\Phi 1$ and $\Phi 1L$. The first to fourth transfer electrode pairs 3 to 6 and the output gate 7 are arranged in parallel, and an N-well 8 is formed under the first to fourth transfer electrode pairs 3 to 6 and the output gate 7.

The CCD 1 includes a main CCD region 1-1, and an output region 1-2. In the main CCD region 1-1, the N-well 8 has a constant width of W, while the width of the N-well 8 is tapered down toward the output gate 7 within the output region 1-2.

The first transfer electrode pairs 4 and the second transfer electrode pairs 3 are positioned in the main CCD region 1-1, while the third transfer electrode pairs 6, the fourth transfer electrode pairs 5 and the output gate 7 are positioned in the output region 1-2. Although only two of the first and second transfer electrode pairs 3 and 4 are illustrated, respectively, it should be understood that the number of the first and second transfer electrode pairs 3 and 4 is larger than that of the third and fourth transfer electrode pairs 5 and 6. The first transfer electrode pairs 4, which are positioned in the main CCD region 1-1, each include barrier and storage electrodes 4-1 and 4-2, and the second transfer electrode pairs 3 each include barrier and storage electrodes 3-1 and 3-2. Correspondingly, the third transfer electrode pairs 6, which are positioned in the output region 1-2, each include barrier and storage electrodes 6-1 and 6-2, and the fourth transfer electrode pairs 5 each include barrier and storage electrodes 5-1 and 5-2. Finally, the output gate 7 includes first and second output gate electrodes 7-1 and 7-2.

The floating diode 9 receives signal charges transferred thereto through the N-well 8, and retain the signal charges until the signal charges are read out by an output circuit 12. The reset gate 10 receives a reset pulse signal $\Phi R$ through a reset pulse feed line 35. The reset gate 10 periodically drains the signal charges retained in the floating diode 9 into the reset drain 11 in response to the reset pulse signal $\Phi R$.

The output circuit 12 includes a MOS transistor 14 and a resistor 15. The gate of the MOS transistor 14 is connected with the floating diode 9, and the drain of the MOS transistor 14 is biased to the power supply level VDD. The source of the MOS transistor 14 is connected with ground through the resistor 15. The output circuit 12 thus designed function as an output pre-amplifier that develops an output signal Vout on an output terminal 13.

The clock generator 2 is provided with a clock generating circuit 21 and a set of inverters 22. The clock generating circuit 21 generates the first to fourth clock signals $\Phi 1$, $\Phi 2$, $\Phi 1L$ and $\Phi 2L$ from a common reference clock. The inverters 22 each functions as a driver circuit for waveform shaping. The first to fourth clock signals $\Phi 1$, $\Phi 2$, $\Phi 1L$ and $\Phi 2L$ generated by the clock generating circuit 21 are fed to first to fourth clock signal lines 31 to 34, respectively, after the waveform shaping by the inverters 22. More specifically, the first clock signal $\Phi 1$ is fed to the barrier and storage electrodes 4-1 and 4-2 of the first transfer electrode pairs 4 through the first clock signal line 32, and the second clock signal $\Phi 2$ is fed to the barrier and storage electrodes 3-1 and 3-2 of the second transfer electrode pairs 3 through the second clock signal line 31. Correspondingly, the third clock signal $\Phi 1L$ is fed to the barrier and storage electrodes 6-1 and 6-2 of the third transfer electrode pairs 6 through the third clock signal line 34, and the fourth clock signal $\Phi 2L$ is fed to the barrier and storage electrodes 5-1 and 5-2 of the fourth transfer electrode pairs 5 through the fourth clock signal line 33. It should be noted that the third clock signal line 34 is connected with only the third transfer electrode pairs 6, and the fourth clock signal line 33 is connected with only the fourth transfer electrode pairs 5.

Figure 8:
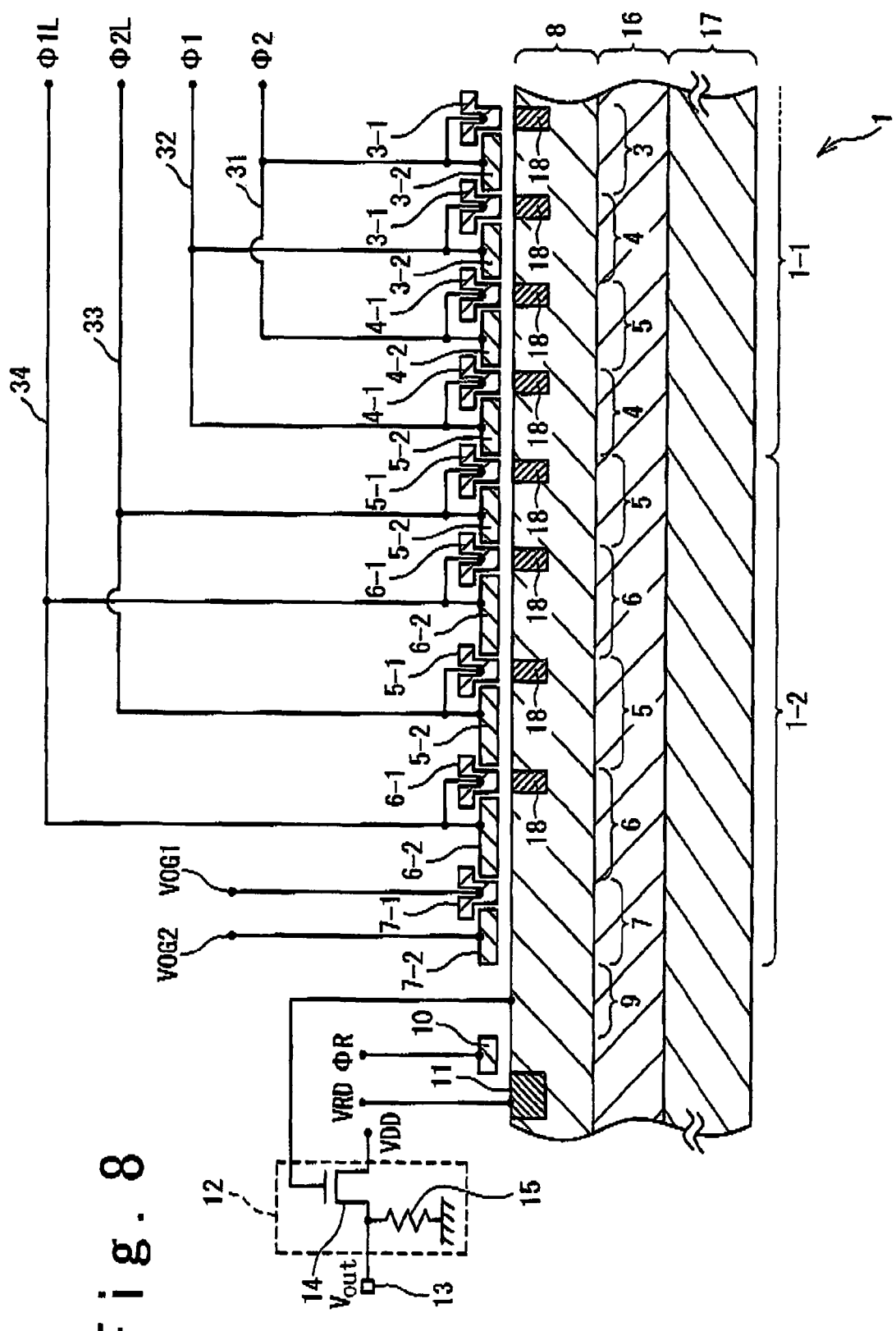
FIG. 8 is a section view illustrating the structure of the solid-state image sensing device in the first embodiment.

FIG. 8 is a sectional view illustrating the structure of the CCD 1 on the A-A' section of FIG. 7. A P-well 16 is formed within an N-type semiconductor substrate 17 and the N-well 8 is formed in the surface portion of the P-well 16. The transfer electrode pairs 3 to 6 are positioned above the N-well 8. Barrier regions 18 are formed under the barrier electrodes 3-1, 4-1, 5-1 and 6-1 of the respective transfer electrode pairs 3 to 6 across gate dielectrics. The barrier regions 18 are formed by ion implantation of P-type impurities (such as B ions), and provides the voltage level difference in the transfer channel under the same transfer electrode pair. Regions positioned under the storage electrodes 3-2, 4-2, 5-2 and 6-2 of the respective transfer electrode pairs 3 to 6 are used as storage regions for accumulating signal charges in the transfer channel. The floating diode 9, used for charge detection, is positioned between the output gate 7 and the reset gate 10. The floating diode 9 incorporates a pn junction formed between the N-well 8 and the P well 16.

Figure 9:
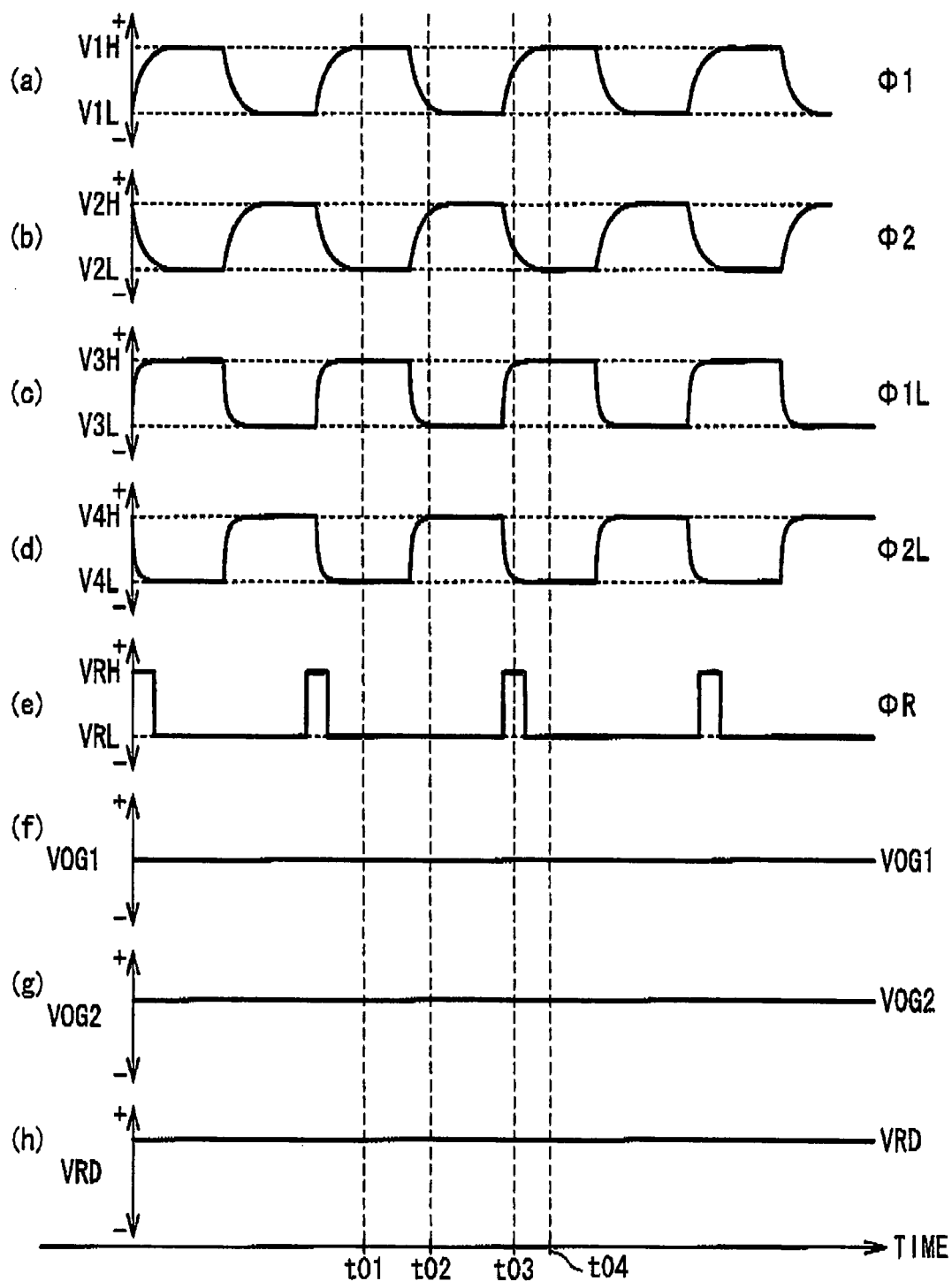
FIG. 9 is a timing chart illustrating the operation of the solid-state image sensing device in the first embodiment.

FIG. 9 is a timing chart of the signals and the bias voltages fed to the CCD 1. FIG. 9(a) illustrates the voltage waveform of the first clock signal Φ1. In FIG. 9(a), the "high" and "low" levels of the first clock signal Φ1 are denoted by the symbols "V1H" and "V1L", respectively. FIG. 9(b) illustrates the voltage waveform of the second clock signal Φ2. In FIG. 9(b), the "high" and "low" levels of the second clock signal Φ2 are denoted by the symbols "V2H" and "V2L", respectively.

FIG. 9(c) illustrates the voltage waveform of the third clock signal Φ1L. In FIG. 9(c), the "high" and "low" levels of the third clock signal Φ1L are denoted by the symbols "V3H" and "V3L", respectively. FIG. 9(d) illustrates the voltage waveform of the fourth clock signal Φ2L. In FIG. 9(d), the "high" and "low" levels of the fourth clock signal Φ2L are denoted by the symbols "V4H" and "V4L", respectively.

FIG. 9(e) illustrates the voltage waveform of the reset pulse signal ΦR. The "high" and "low" levels of the reset pulse signal ΦR are denoted by the symbols "VRH" and "VRL", respectively.

FIG. 9(f) illustrates the waveform of the first output gate voltage VOG1, which is fed to the first output gate electrode 7-1. Preferably, the first output gate voltage VOG1 is controlled so that the voltage level of the charge transfer channel under the first output gate electrode 7-1 (referred to as the channel voltage level v1, hereinafter) is higher than the voltage level of the charge transfer channel within the storage regions under the second electrodes 6-2 of the third transfer electrode pairs 6 in the case that the third clock signal Φ1L, fed to the third transfer electrode pairs 6, is pulled down to the "low" level V3L (such voltage level is referred to as the channel voltage level vSL, hereinafter). Additionally, the first output gate voltage VOG1 is preferably controlled so that the channel voltage level v1 is lower than the voltage level of the charge transfer channel within the storage regions under the second electrodes 6-2 of the third transfer electrode pairs 6 in the case that the third clock signal Φ1L is pulled up to the "high" level V3H (such voltage level is referred to as the channel voltage level vSH, hereinafter).

FIG. 9(g) illustrates the waveform of the second output gate voltage VOG2. Preferably, the second output gate voltage VOG2 is controlled so that the voltage level of the charge transfer channel under the second output gate electrode 7-2 (referred to as the channel voltage level v2, hereinafter) is higher than the channel voltage level v1 of the charge transfer channel under the first output gate electrode 7-1. FIG. 9(h) illustrates the waveform of the reset drain voltage VRD. Preferably, the "high" level VRH of the reset pulse signal ΦR is determined so that the voltage level of the channel under the reset gate 10 is higher than the reset drain voltage VRD applied to the reset drain 11 when the reset pulse signal ΦR is pulled up to the "high" level.

At the time t01, as shown in FIG. 9, the first clock signal Φ1 is set to the "high" level V1H, and the third clock signal Φ1L is set to the "high" level V3H. At the time t02, the first clock signal Φ1 is pulled down to the "low" level V1L and the second clock signal Φ2 is pulled up to the "High" level V2H. At the time t03, a reset pulse signal ΦR is pulled up to the "high" level VRH. At the time t04, as is the case of the time t01, the first clock signal Φ1 is set to the "high" level V1H.

Figure 10:
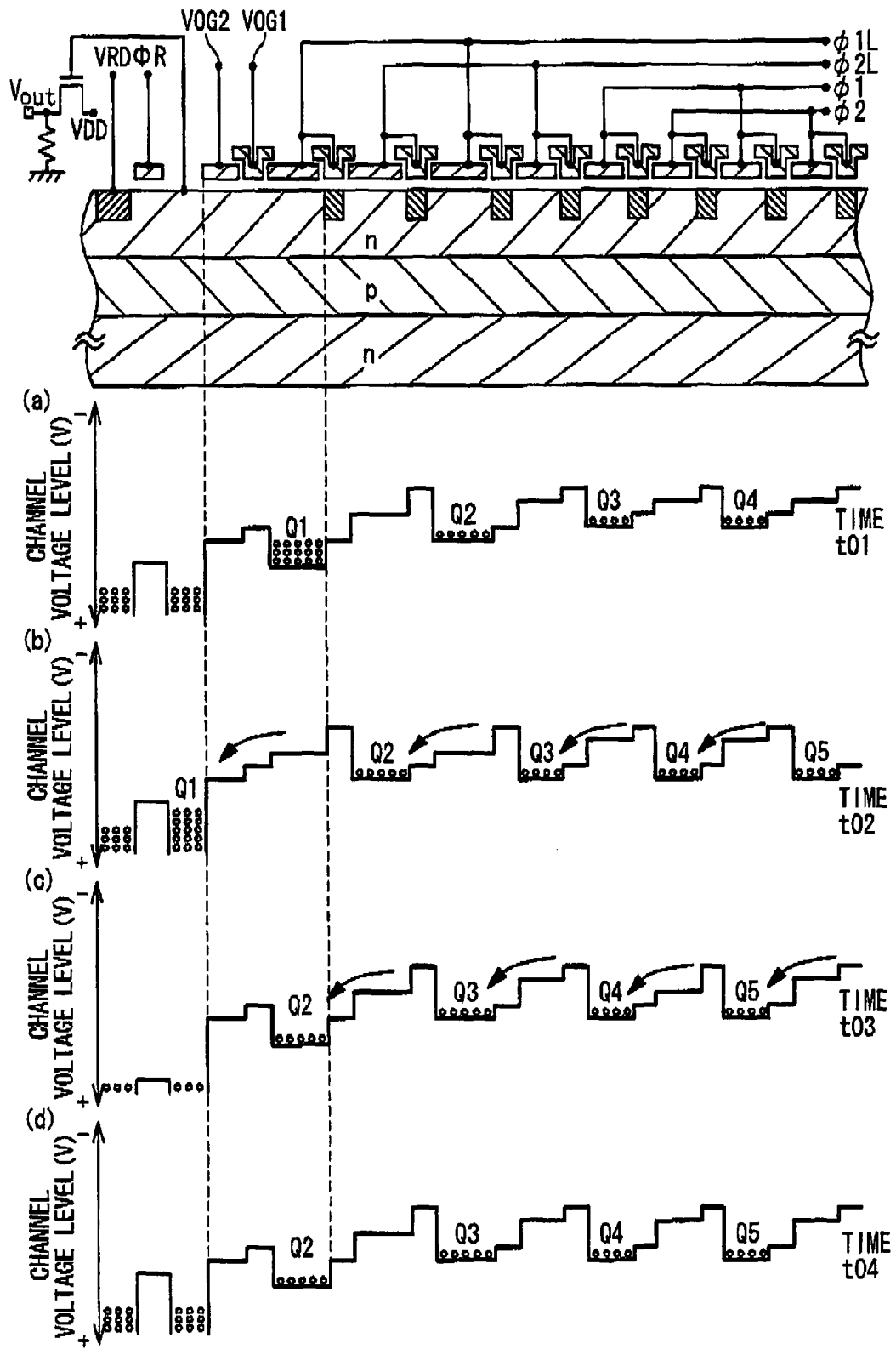
FIG. 10 is a schematic diagram illustrating the manner in which signal charges are transferred over the CCD.

FIG. 10 illustrates the manner in which the CCD 1 transfers signal charges in response to the above-described clock signals. At the time t01, signal charges Q1 are accumulated in the storage region under the third charge transfer electrode pair 6 adjacent to the output gate 7 (that is, the diffusion region under the storage electrode 6-2 of the third transfer electrode pair 6). The signal charges Q1 are injected into the floating diode 9 after passing under the first and second output gate electrodes 7-1 and 7-2 at the time t02.

Subsequently, the reset pulse signal ΦR, fed to the reset gate 10, is pulled up to the "high" level VRH, and thereby the signal charges Q1 are drained outside through the reset drain 11. At this time, next signal charges Q2 are accumulated in the storage region under the third charge transfer electrode pair 6 adjacent to the output gate 7 (that is, the diffusion region under the storage electrode 6-2 of the third transfer electrode pair 6). This is followed by pulling down the reset pulse signal ΦR to the "low" level VRL to return the same state as the time t01. Such operation is repeated afterward to detect signal charges Q3, Q4, Q5 . . . as the output voltage.

Figure 11:
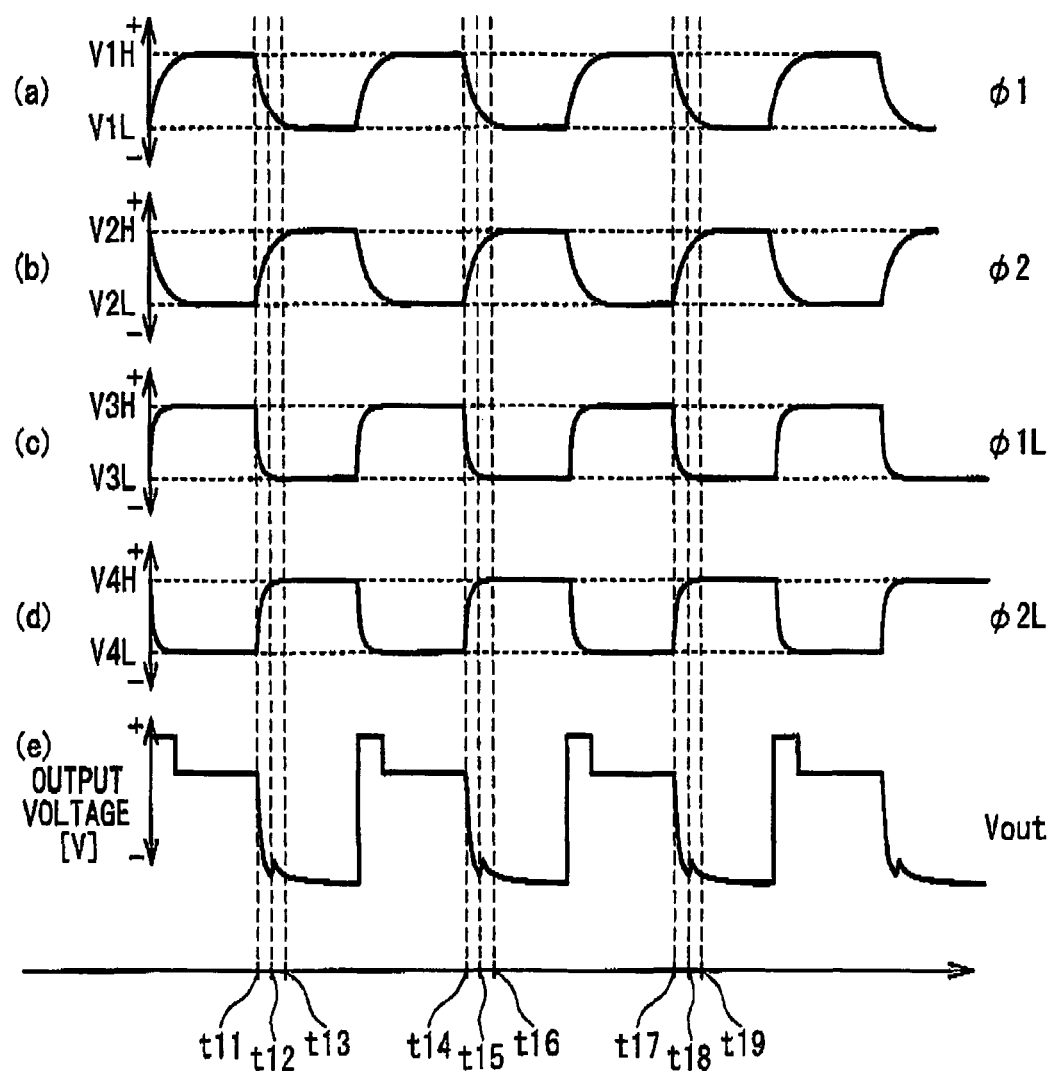
FIG. 11 is a timing chart illustrating the waveform of the output voltage generated by the clock signals.

In the following, a description is given of the change of the output voltage in response to the clock signals. FIG. 11 is a timing chart illustrating waveforms of the clock signals Φ1, Φ2, Φ1L and Φ2L and the waveform of the output voltage Vout. In detail, FIG. 11(a) illustrates the waveform of the first clock signals Φ1, and FIG. 11(b) illustrates the waveform of the second clock signal Φ2. Additionally, FIG. 11(c) illustrates the waveform of the third clock signals Φ1L, and FIG. 11(d) illustrates the waveform of the fourth clock signal Φ4. Finally, FIG. 11(e) illustrates the waveform of the output voltage Vout, which changes in response to the above-described clock signals.

As shown in FIG. 11, it is during the time periods between the time t11 and the time t13, between the time t14 and the time t16, and between the time t17 to t19 that the first clock signal Φ1 is pulled down and the second clock signal Φ2 is pulled up. On the other hand, it is during the time periods between the time t11 and the time t12, between the time t14 and the time t15, and between the time t17 and the time t18 that the third clock signal Φ1L is pulled down and the fourth clock signal Φ2L is pulled up.

As is understood from FIG. 11, the first and second clock signals Φ1 and Φ2 exhibit duller trailing edges than the third and fourth clock signals Φ1L and Φ2L. This results from the difference in the load capacitance among the clock signal lines 31 to 34. The load capacitances of the first and second clock signal lines 31 and 32 are in the order of several hundreds picofarads in accordance with the numbers of the first and second transfer electrode pairs 3 and 4. On the other hand, the load capacitances of the third and fourth clock signal lines 33 and 34 are several tens picofarads or less, in accordance with the reduced number of the third and fourth transfer electrode pairs 5 and 6. Therefore, the CR time constants of the third and fourth clock signal lines 33 and 34 are less than those of the first and second clock signal lines 31 and 32, in the transmission of the clock signals fed to the clock signal lines 31 to 34.

Figure 12:
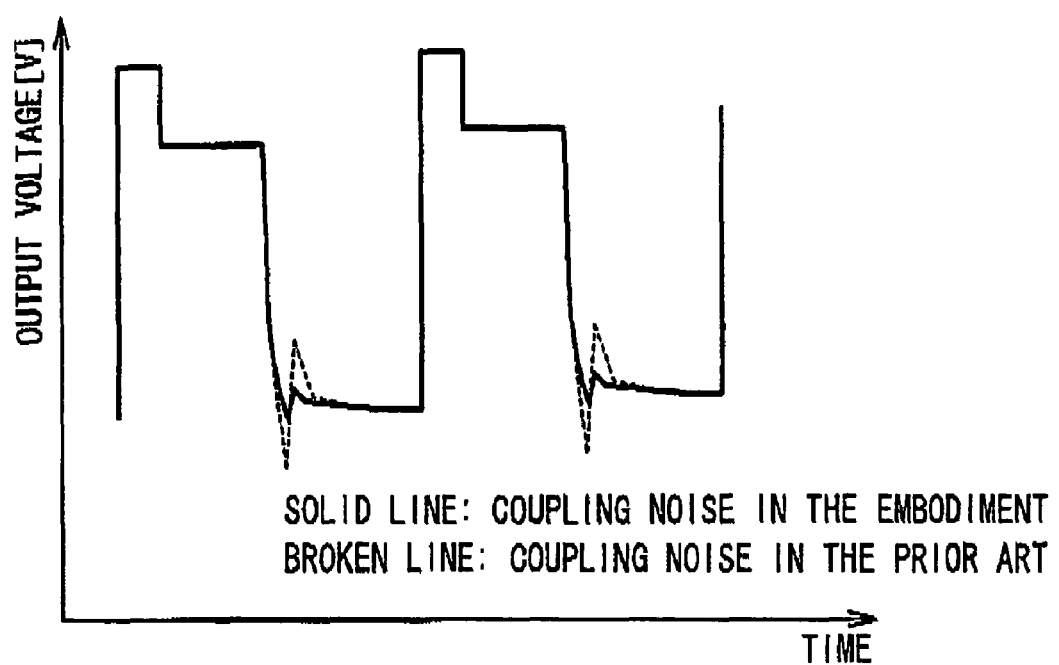
FIG. 12 is an enlarged waveform chart illustrating the coupling noise observed on the output voltage in the first embodiment.

FIG. 12 illustrates an enlarged waveform of the output voltage, exhibiting noise caused by the clock signals. As described above, it is during the time period between the time t11 and the time t13 that the first clock signal Φ1 is pulled down and the second clock signal Φ2 is pulled up. On the other hand, it is during the time period between the time t11 and the time t12 that the third clock signal Φ1L is pulled down and the fourth clock signal Φ2L is pulled up. It should be noted that the duration of time necessary for pulling down the third clock signal Φ1L and pulling up the fourth clock signal Φ2L is shorter than that necessary for pulling down the first clock signal Φ1 and pulling up the second clock signal Φ2, because of the shorter CR time constants.

The third and fourth clock signals Φ1L and Φ2L have symmetric voltage waveforms, and the duration of time during which the third clock signal Φ1L is pulled up is same as the duration of time during which the fourth clock signal Φ2L is pulled down. Therefore, the effect of the coupling with the floating diode 9 is cancelled between the third and fourth clock signals Φ1L and Φ2L, and the output voltage exhibits reduced coupling noise as indicated by the solid line in FIG. 12.

It should be noted that the first and second clock signals Φ1 and Φ2 cause reduced coupling noise on the output voltage. This is because the first and second clock signals Φ1 and Φ2 have symmetric voltage waveforms, and the duration of time during which the first clock signal Φ1 is pulled up is same as the duration of time during which the second clock signal Φ2 is pulled down; the effect of the coupling with the floating diode 9 is also cancelled between the first and second clock signals Φ1 and Φ2. Therefore, the CCD 1 in this embodiment effectively suppresses the reduction of the stable period of the output voltage as shown in FIG. 12, while the conventional CCD suffers from the reduction in the stable period due to the coupling noise caused by the third clock signal Φ1L.

As described above, in order to facilitates the transmission of the signal charges from the main CCD region 1-1 to the floating diode 9, the width of the N-well 8 is tapered down towards the output gate 7 from the final-stage transfer electrode pair 4, while the length of the storage electrodes 5-2 and 6-2 within the output region 1-2 is longer than the storage electrodes 3-2 and 4-2 within the main CCD region 1-1.

Figure 13:
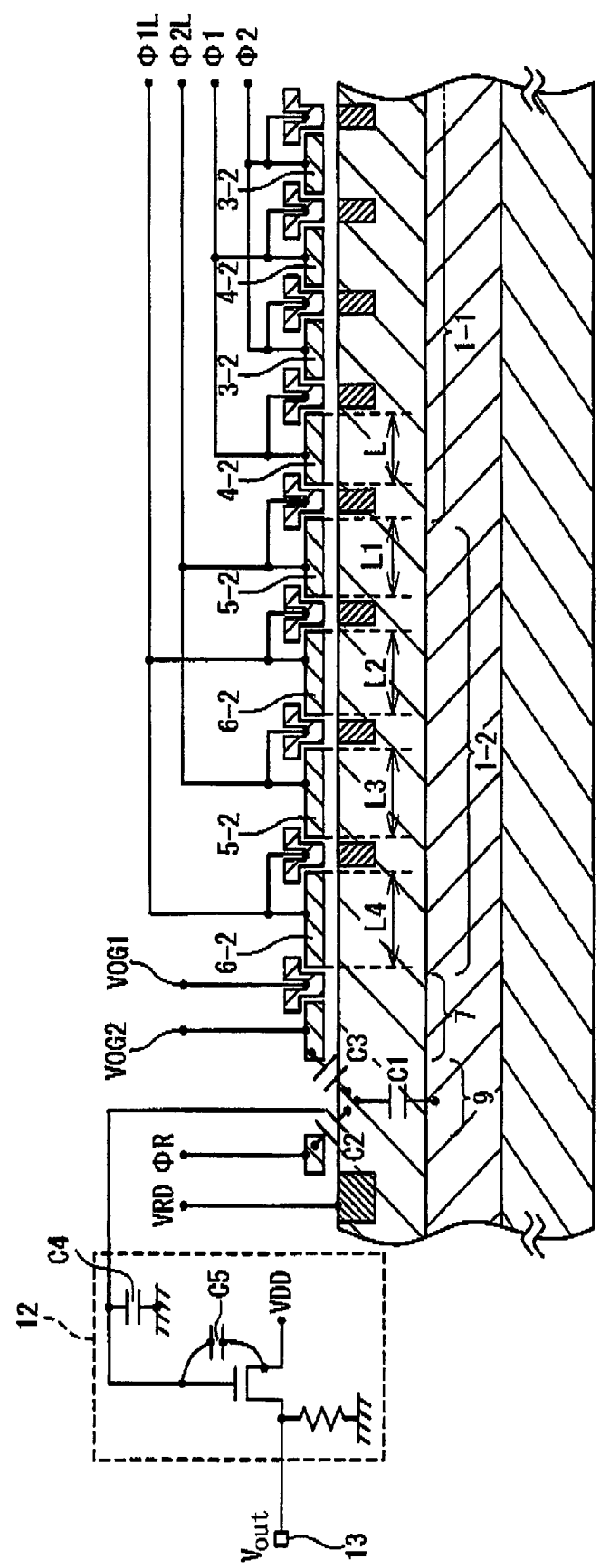
FIG. 13 is a section view illustrating the parasitic capacitances formed within the solid-state image sensing device in the first embodiment.

FIG. 13 is a sectional view illustrating parasitic capacitances formed within the solid-state image sensing device of this embodiment. Within the CCD 1 of this embodiment, the following five parasitic capacitances are formed: (1) a first capacitance C1 which is the junction capacitance of the floating diode 9; (2) a second capacitance C2 which is the coupling capacitance between the floating diode 9 and the reset gate 10; (3) the third capacitance C3 which is the coupling capacitance between the floating diode 9 and the second output gate electrode 7-2; (4) a fourth capacitance which is an interconnection capacitance of the interconnection connected between the floating diode 9 and the output circuit 12; and (5) a fifth capacitance which is the input capacitance of the output circuit 12. The change ΔV in the voltage level of the floating diode 9 is represented by the following equation (1):

$$\Delta V = Q1/(C1+C2+C3+C4+C5). \quad (1)$$

The voltage level change ΔV is detected by the output circuit 12, which includes the MOS transistor 14 and the resistor 15, and the output voltage Vout is outputted from the output terminal 13 in response to the voltage level change ΔV.

The output voltage Vout is represented by the following equation (2):

$$V\text{out} = \Delta V \cdot gm \cdot R/(1+gm \cdot R), \quad (2)$$

where gm is the mutual conductance of the MOS transistor 14, and R is the resistance of the resistor 15. From the equations (1) and (2), the output voltage Vout is obtained by the following equation (3):

$$V\text{out} = Q1 \cdot gm \cdot R/\{(1+gm \cdot R)(C1+C2+C3+C4+C5)\} \quad (3)$$

As is understood from the equation (3), the increase in the output voltage Vout for the given signal charges Q1 requires a decrease in the first to fifth capacitances C1 to C5. The decrease in the first to fifth capacitances C1 to C5 can be achieved by the reduction of the junction area of the floating diode 9.

The maximum signal charge amount QMAX is expressed as the following equation (4):

$$Q\text{MAX} = K \cdot \Delta v B \cdot W \cdot L, \quad (4)$$

where ΔvBS is the difference in the channel voltage level between the barrier regions and the storage regions of the respective transfer electrode pairs, K is a constant of proportion, W is the charge transfer channel width of the storage regions, and L is the charge transfer channel length of the storage regions.

The charge transfer channel length L of the storage regions is determined on the basis of the size of the solid-state image sensing device and the number of the pixels arrange in the horizontal direction. Additionally, the voltage level difference ΔvBS can not be easily modified from the viewpoint of the allowed drive voltage (for example, 5 V). Therefore, in order to increase in the maximum signal charge amount QMAX in the main CCD region 1-1, the charge transfer channel width W of the storage regions is increased.

The charge transfer channel width W is tapered down toward the floating diode 9 in the output region 1-2 to facilitate the charge transfer to the floating diode 9. This is preferably accompanied by the increase of the charge transfer channel lengths of the storage regions in the output region 1-2. Specifically, at least one of the lengths L1, L2, L3 and L4 of the storage electrodes 5-2 and 6-2 of the charge transfer electrode pairs 5 and 6 (that is, the charge transfer channel lengths under the charge transfer electrode pairs 5 and 6) in the output region 1-2 is longer than the length L of the storage electrodes 3-2 and 4-2 of the charge transfer electrode pairs 3 and 4 in the main CCD region 1-1. In this embodiment, the lengths of the storage electrodes 5-2 and 6-2 of the transfer electrode pairs 5 and 6 in the output region 1-2 are increased as the decrease in the charge transfer channel width W1 to provide the output region 1-2 with the same maximum signal charge amount QMAX as that in the main CCD region 1-1. The necessity of the increase in the charge transfer channel lengths in the output region 1-2 would be easily understood from the above-described equation (4). More specifically, as shown in FIG. 13, the lengths L1, L2, L3 and L4 of the storage electrodes 5-2 and 6-2 in the output region 1-2 are determined so that is holds:

$$L4>L3>L2>L1>L,$$

where L is the length of the storage electrodes 3-2 and 4-2 in the main CCD region 1-1.

Figure 14:
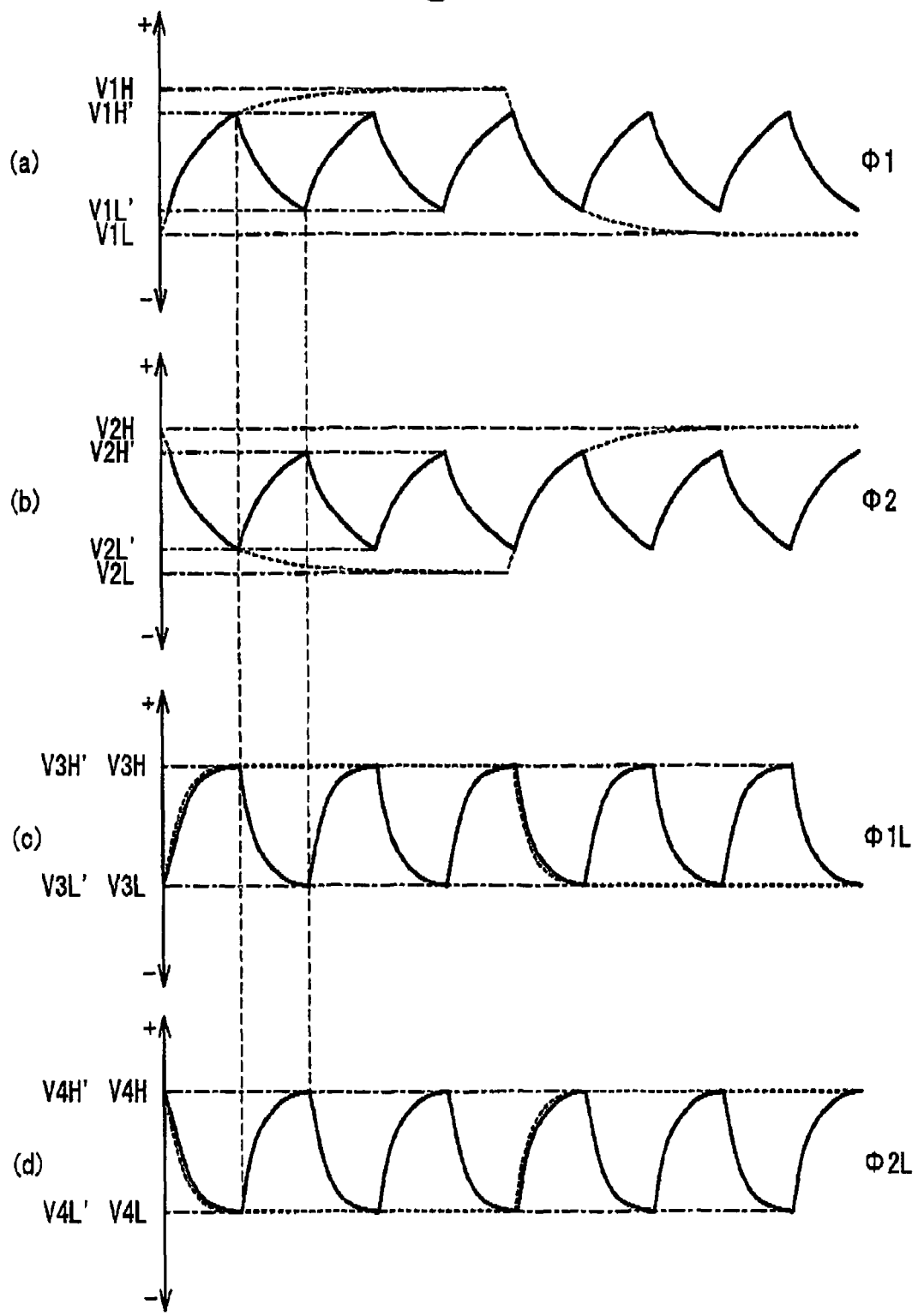
FIG. 14 is a timing chart illustrating the waveforms of clock signals in high-speed operation.

FIG. 14 is a timing chart providing the comparison between the high-speed operation and the normal-speed operation of the solid-state image sensing device in this embodiment. The broken lines indicate waveforms of the clock signals Φ1, Φ2, Φ1L and Φ2L for the normal-speed operation, and the solid lines indicate waveforms of the same for the high-speed operation in which the charge transfer speed is increased up to triple of the operation speed in the normal-speed operation. As described above, in the normal speed operation, the "high" and "low" levels of the first clock signal Φ1 are V1H and V1L, respectively, and the "high" and "low" levels of the second clock signal Φ2 are V2H and V2L, respectively. Correspondingly, the "high" and "low" levels of the third clock signal Φ1L are V3H and V3L, respectively, and the "high" and "low" levels of the fourth clock signal Φ2L are V4H and V4L, respectively. In one embodiment, the first to fourth clocks signals Φ1, Φ2, Φ1L and Φ2L have the same "high" level, and the same "low" level, In other words, it holds:

V1H=V2H=V3H=V4H=VH, and

V1L=V2L=V3L=V4L=VL.

The clock signal lines 31 and 32, used to feed the second and first clock signals Φ2 and Φ1, respectively, have large load capacitances, because of the increased numbers of the first and second transfer electrode pairs 3 and 4 in the main CCD region 1-1. Therefore, in the high-speed operation, the first and second clock signals Φ1 and Φ2 may be switched before reaching the original "high" and "low" levels VH and VL achieved in the normal-speed operation, because of the increased CR time constant of the clock signal lines 31 and 32. As shown in FIG. 14(a), for example, the first clock signal Φ1 exhibits a decreased amplitude between V1H' and V1L' in the high-speed operation, compared to the normal operation. Correspondingly, the second clock signal Φ2 exhibits a decreased amplitude between V2H' and V2L' in the high-speed operation, as shown in FIG. 14(b).

On the contrary, the clock signal lines 33 and 34, used to feed the fourth and third clock signals Φ2L and Φ1L, respectively, have small load capacitances, because of the decreased numbers of the third and fourth transfer electrode pairs 5 and 6 in the output region 1-2. Therefore, the third and fourth clock signals Φ1L and Φ2L reach the "high" and "low" levels VH and VL in the high-speed operation as in the normal-speed operation, because of the decreased CR time constant of the clock signal lines 31 and 32.

Figure 15:
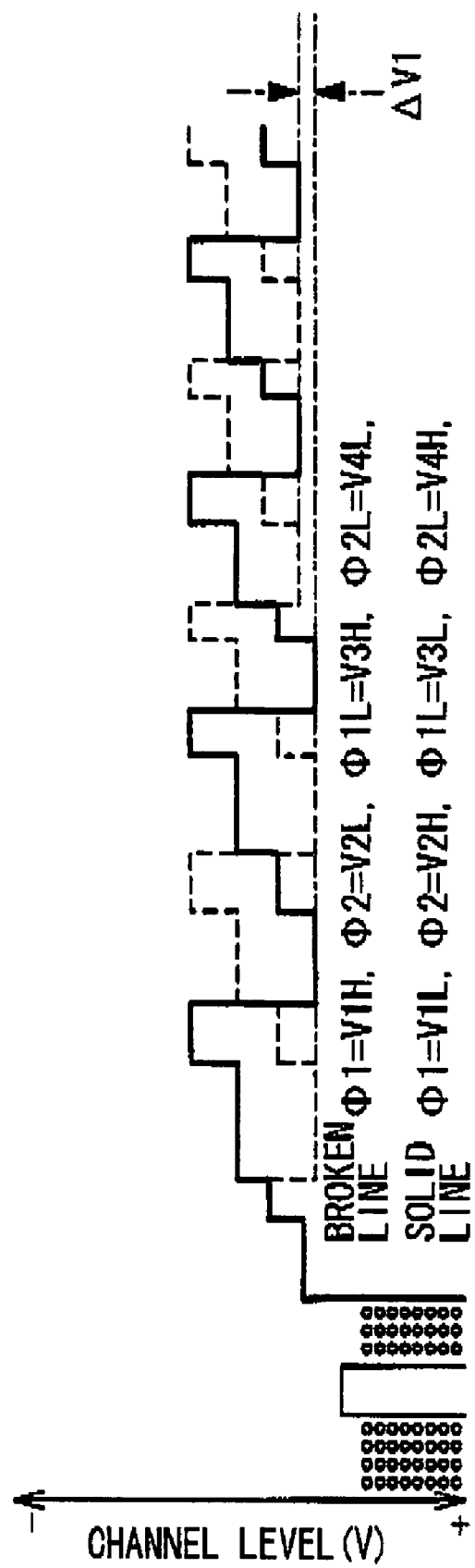
FIG. 15 is a schematic diagram illustrating a potential profile across the CCD for the high speed charge transmission.

FIG. 15 illustrates the potential profile of the charge transfer channel in the high-speed operation in the first embodiment. The broken line indicates the channel voltage level for the case when the first to fourth clock signals Φ1, Φ2, Φ1L and Φ2L are set to V1H, V2L, V3H and V4L, respectively, while the solid line indicates the channel voltage level for the case when the first to fourth clock signals Φ1, Φ2, Φ1L and Φ2L are set to V1L, V2H, V3L and V4H, respectively.

In this embodiment, the fourth and third clock signal lines 33 and 34, used to feed the fourth and third clock signals Φ2L and Φ1L to the transfer electrode pairs 5 and 6 in the output region 1-2, are provided separately from the second and first clock signal lines 31 and 32. Therefore, the third and fourth clock signals Φ1L and Φ2L exhibits an amplitude of |V1H-V1L| in the high speed operation.

As a result, the channel voltage level of the storage regions under the third and fourth transfer electrode pairs 6 and 5 in the output region 1-2 is deeper than that in the main CCD region 1-1 by ΔV1, as shown in FIG. 15. This allows making use of the fringing field effect to thereby suppress the charge transfer failure in the output region 1-2.

Second Embodiment

In the following, a description is given of a second embodiment of the present invention. In the following, same elements are denoted by same numerals as in the first embodiment; elements denoted by the same numeral are identically designed to provide the same function. Therefore, duplicated descriptions are not given for the elements denoted by the same numeral in the first embodiment.

Figure 16:
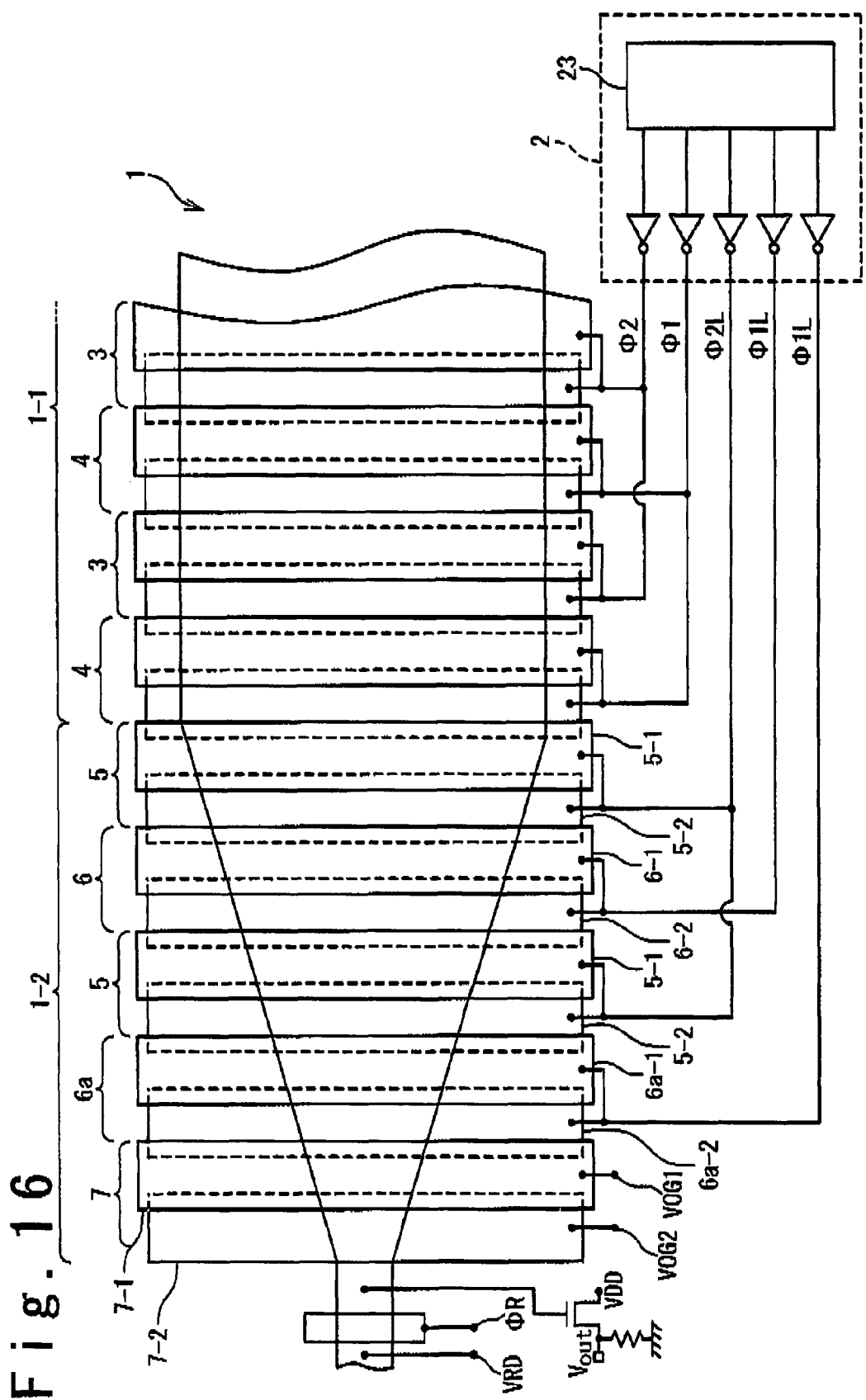
FIG. 16 is a plan view illustrating the structure of a solid-state image sensing device in a second embodiment of the present invention.

FIG. 16 is a plan view of the solid-state image sensing device in the second embodiment. The solid-state image sensing device in the second embodiment is provided with the CCD 1 and the clock generator 2. The CCD 1 additionally includes a fifth transfer electrode pair 6a. The solid-state image sensing device in the second embodiment achieves summing signal charges of two adjacent pixels through appropriately controlling the waveform of the fifth clock signal Φ1L'. The clock generator circuit 23 within the clock generator 2 generators the fifth clock signal Φ1L' in addition to the first to fourth clock signals Φ1, Φ2, Φ1L and Φ2L. The fifth transfer electrode pair 6a includes a barrier electrode 6a-1 and a storage electrode 6a-2, which are fed with the fifth clock signal Φ1L'.

Figure 17:
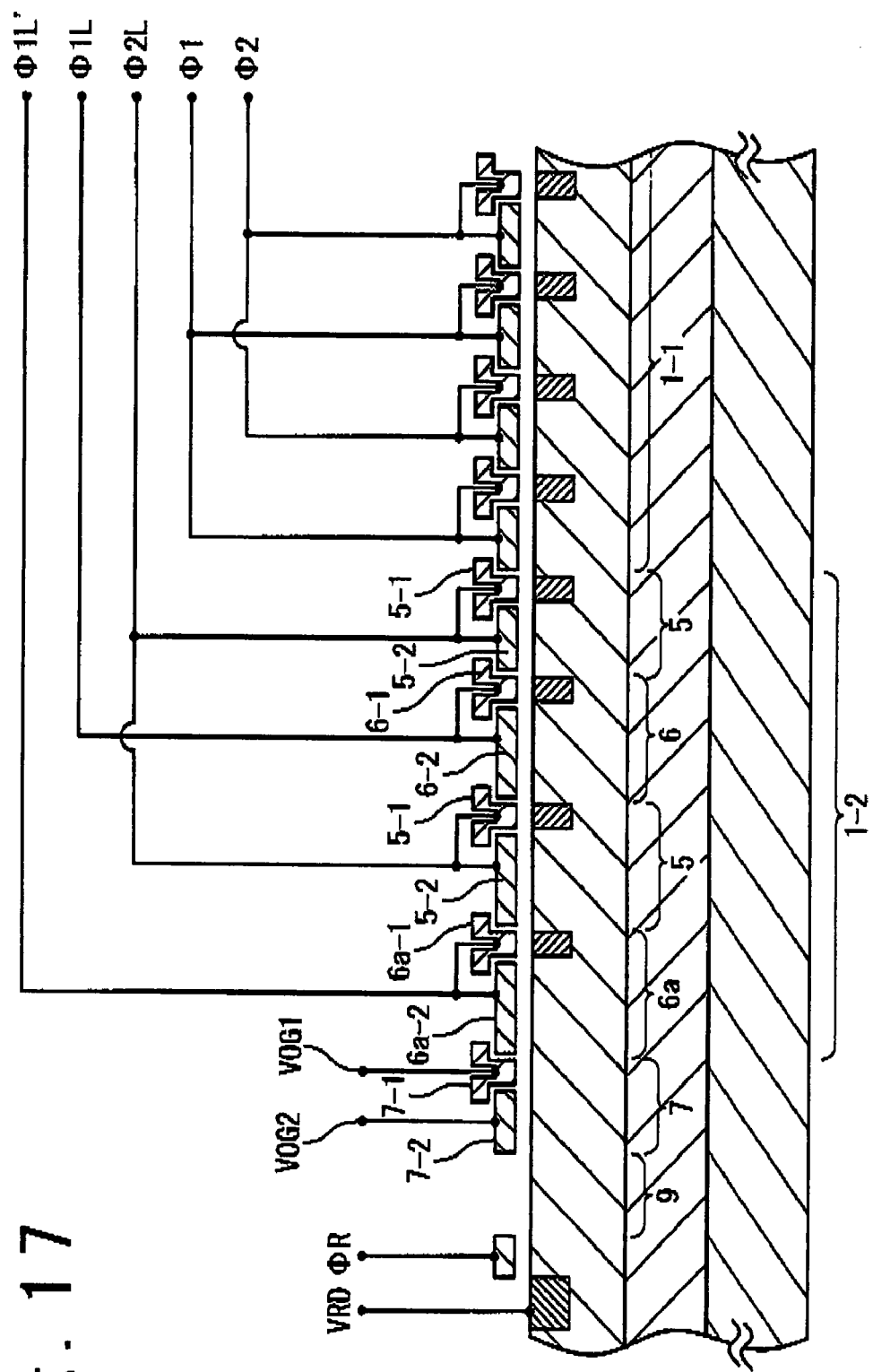
FIG. 17 is a section view illustrating the structure of the solid-state image sensing device in the second embodiment.

FIG. 17 is a sectional view illustrating the structure of the solid-state image sensing device in the second embodiment. The fifth transfer electrode pair 6a is positioned adjacent to the output gate 7 between the output gate 7 and the third and fourth transfer electrode pairs 5 and 6. The fifth transfer electrode pair 6a transfers signal charges received from the adjacent fourth transfer electrode pair 5 to the floating diode 9 through the output gate 7 in response to the fifth clock signal Φ1L'.

Figure 18:
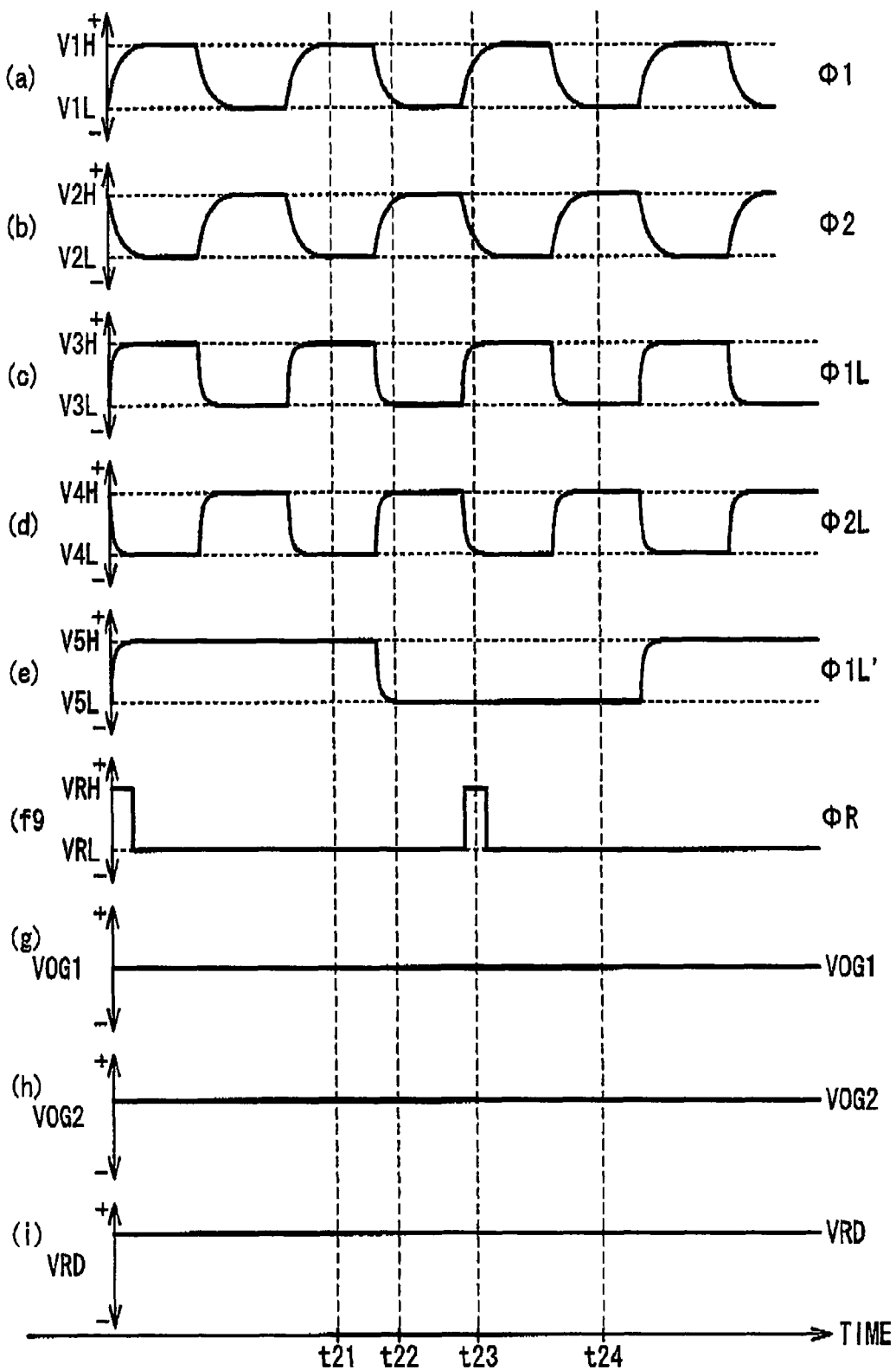
FIG. 18 is a timing chart illustrating the operation of the solid-state image sensing device in the second embodiment.

FIG. 18 is a timing chart illustrating the operation timing of the CCD 1 in the second embodiment. As shown in FIG. 18, one cycle period of the fifth clock signal Φ1L' is three times as long as the cycle period of the third clock signal Φ1L. The "high" and "low" levels of the fifth clock signal Φ1L' are V5H and V5L, respectively. At the time t21, the first and third clock signals ΦD and Φ1L are set to the "high" level, and the second and fourth clock signals Φ2 and Φ2L are set to the "low" level. At this time, the fifth clock signal Φ1L', fed to the fifth transfer electrode pair 6a, is set to the "high" level. At the time t22, the first to fifth clock signals Φ1, Φ2, Φ1 ΦL, Φ2L and Φ1L' are reversed. At the time t23, the reset pulse signal ΦR is pulled up to reset the floating diode 9. Finally, at the time t24, the clock signals Φ1, Φ2, Φ1L and Φ2L other than the fifth clock signal Φ1L' are inverted after the reset of the floating diode 9.

Figure 19:
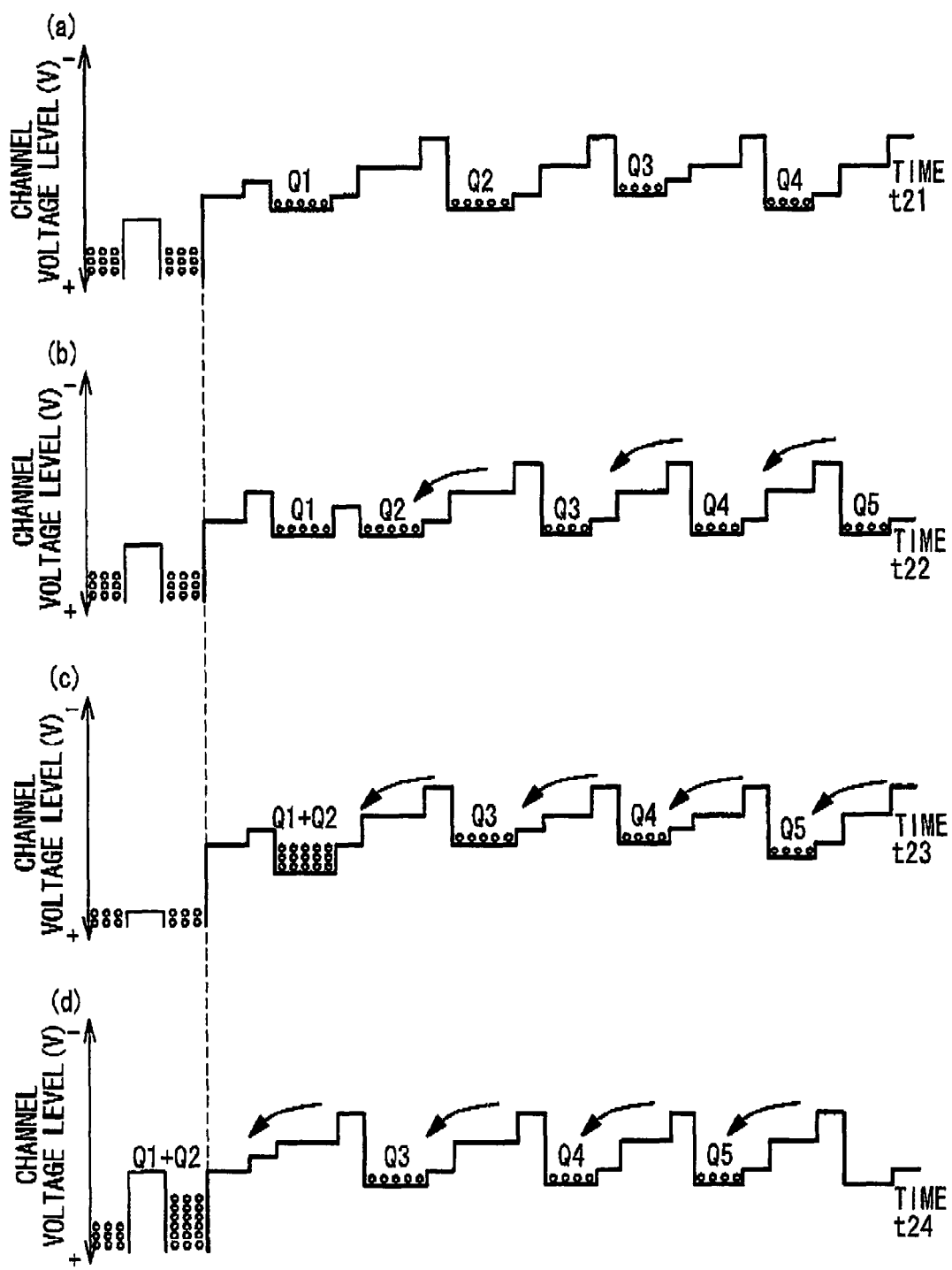
FIG. 19 is a schematic diagram illustrating the potential profile across the CCD in the second embodiment.

FIG. 19 illustrates the charge transfer operation within the CCD 1 in response to the above-described clock signals. At the time t21, signal charges Q1 are accumulated in the storage region under the storage electrode 6a-2. At the time t22, signal charges other than the signal charges Q1, denoted by the numerals Q2 to Q4, are transferred with the signal charges Q1 left intact.

At the time t23, the signals charges Q2 are added to the signal charges Q1 in the storage region under the storage electrode 6a-2. This is followed by injecting the signal charges Q1 and Q2 added together into the floating diode 9 through the channel under the output gate 7. Such operation is repeated to generate the output voltage in response to sums of signal charges Q1+Q2, Q3+Q4 . . . from adjacent two pixels.

Figure 20:
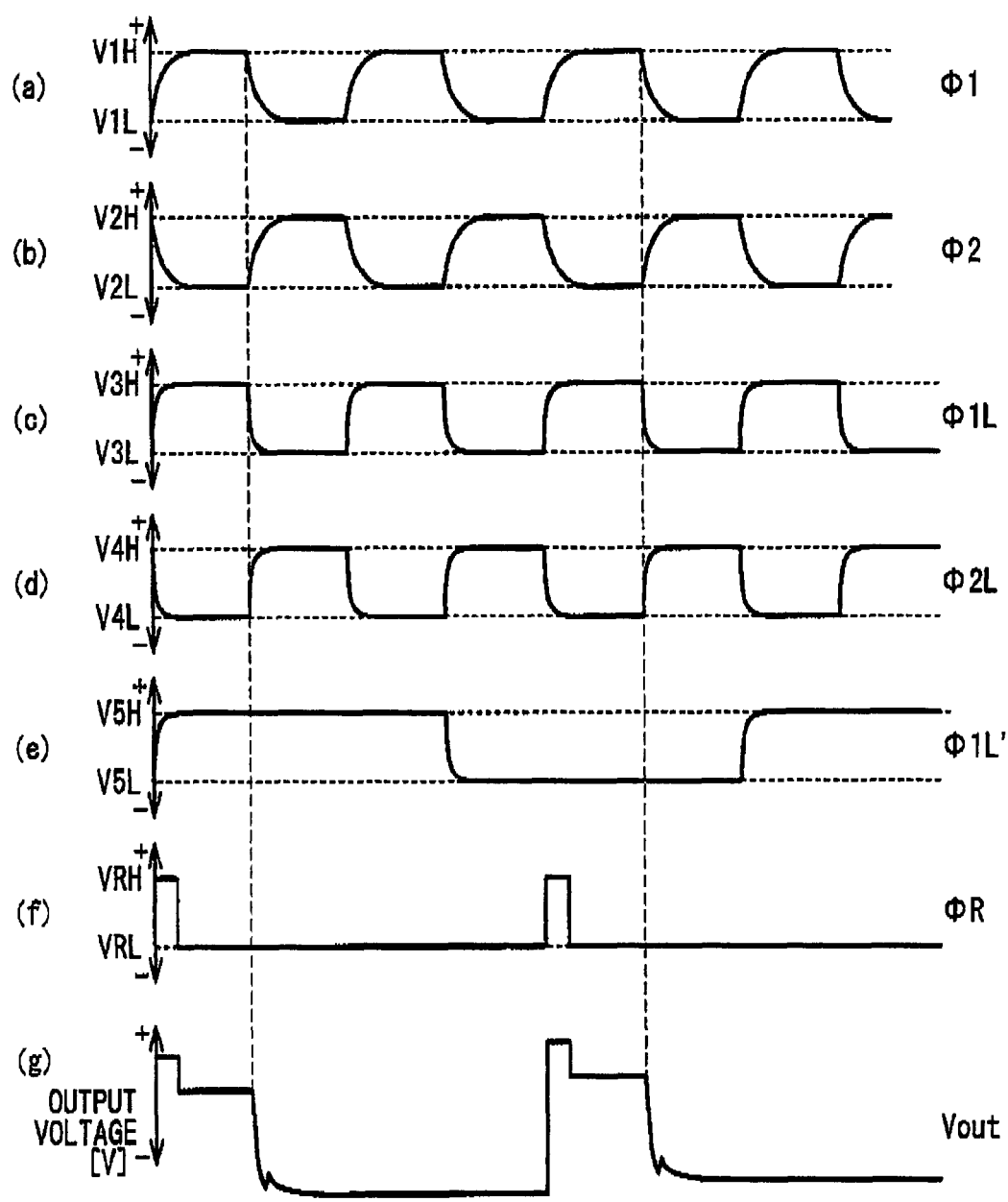
FIG. 20 is a timing chart illustrating the waveform of the output voltage in the second embodiment.

FIG. 20 is a timing chart illustrating the waveform of the output voltage Vout in the second embodiment. As shown in FIG. 20, the output voltage Vout experiences reduced coupling noise in the CCD 1 in the second embodiment as is the case of the first embodiment. The reduction of the coupling noise is owed to the fact that the fifth clock signal Φ1L' is switched at the same delayed timing as the third and fourth clock signals Φ1L and Φ2L.

Figure 21:
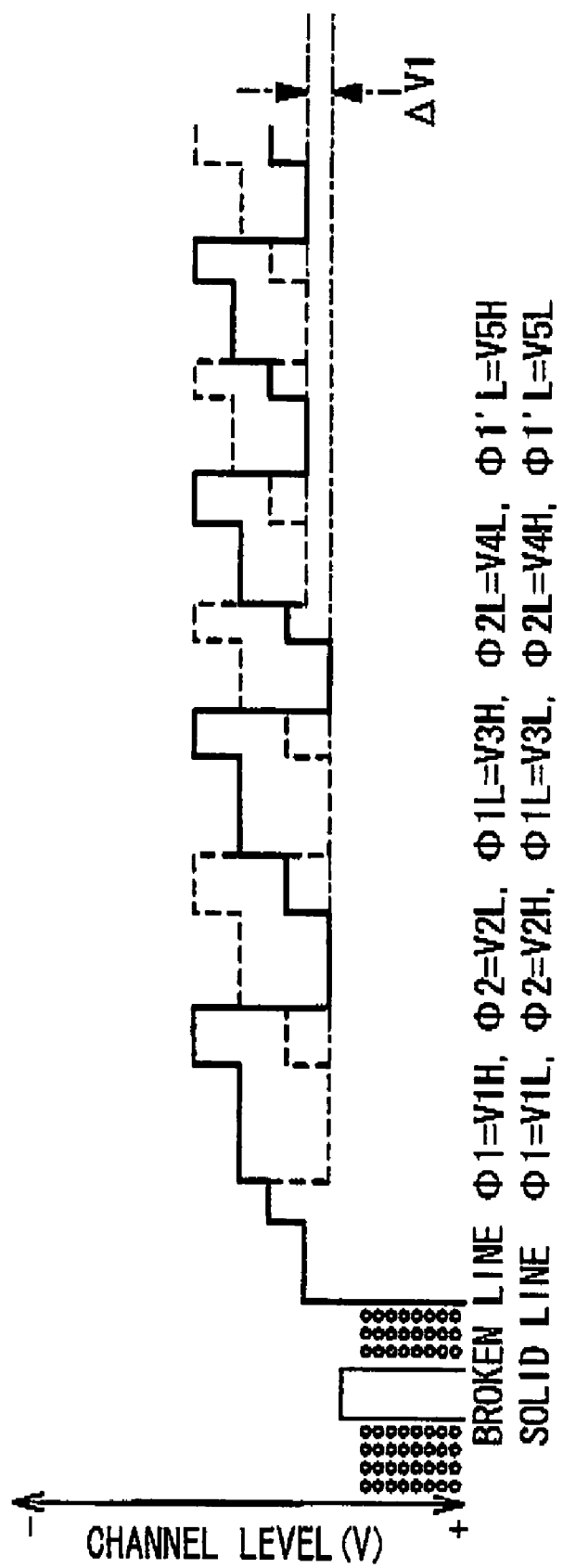
FIG. 21 is a schematic diagram illustrating a potential profile across the CCD for the high speed charge transmission.

Additionally, the solid-state image sensing device in the second embodiment effectively reduces the charge transfer failure in the high-speed operation, as is the case of the first embodiment. FIG. 21 illustrates the potential profile across the CCD 1 in the high speed operation in the second embodiment.

In FIG. 21, the broken line indicates the channel voltage level for the case when the first to fifth clock signals Φ1, Φ2, Φ1L, Φ2L and Φ1L' are set to V1H, V2L, V3H, V4L and V5H, respectively, while the solid line indicates the channel voltage level for the case when the first to fifth clock signals Φ1, Φ2, Φ1L, Φ2L and Φ1L' are set to V1L, V2H, V3L, V4H and V5L, respectively. As shown in FIG. 21, the channel voltage level of the storage regions under the third and fourth transfer electrode pairs 5 and 6 in the output region 1-2 is deeper than that in the main CCD region 1-1 by ΔV1, as shown in FIG. 15. This effectively suppresses the charge transfer failure in the output region 1-2.

As thus described, the design of the CCD 1 in the second embodiment, which detects sums of signal charges of adjacent two pixels, effectively reduces the coupling noise through driving the fifth transfer electrode pair 6a with the fifth clock signal Φ1L', while effectively suppressing the charge transfer failure in the output region 1-2 in the high-speed operation.

Third Embodiment

Figure 22:
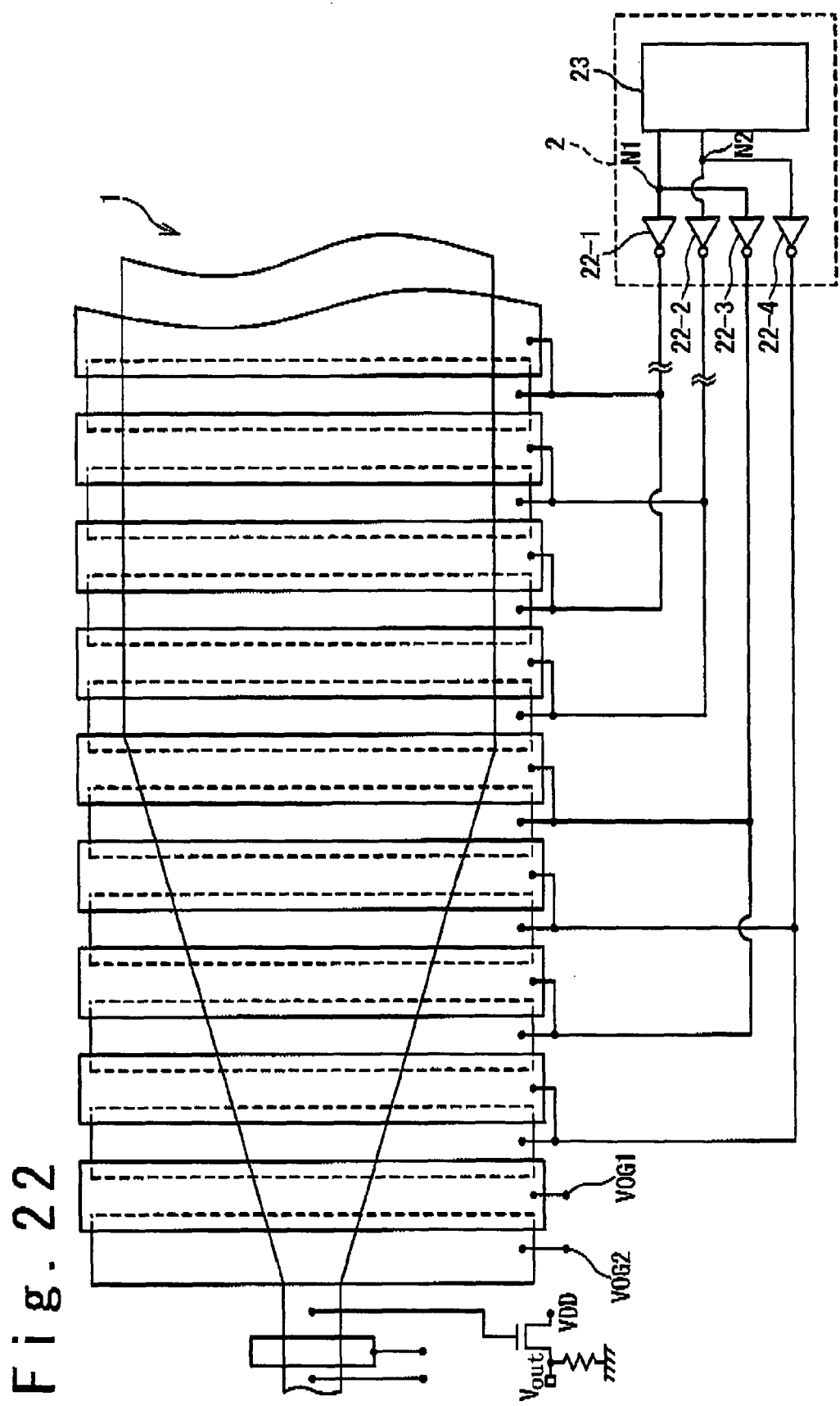
FIG. 22 is a plan view illustrating the structure of a solid-state image sensing device in a third embodiment of the present invention.

FIG. 22 is a plan view illustrating the third embodiment of the present invention. The clock generator 2 in the third embodiment includes a set of inverters 22-1 to 22-4. The inputs of the first and third inverters 22-1 and 22-3 are commonly connected with a first node N1 that is connected with a first output of the clock generator circuit 23. The inputs of the second and fourth inverters 22-2 and 22-4 are commonly connected with a second node N2 that is connected with a second output of the clock generator circuit 23, Such arrangement of the clock generator 2 effectively reduces the number of the outputs of the clock generator circuit 23.

Fourth Embodiment

Figure 23:
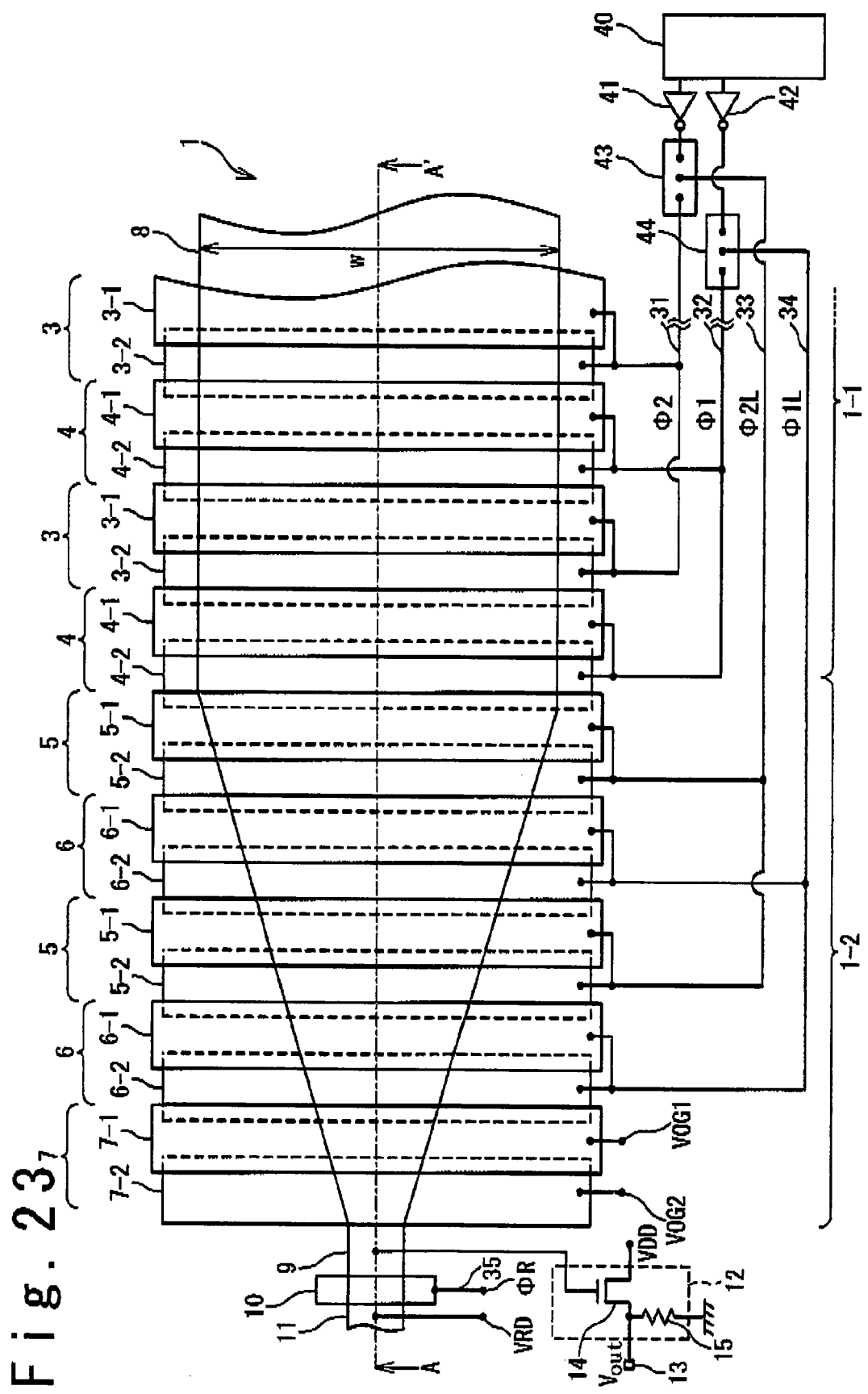
FIG. 23 is a plan view illustrating the structure of a solid-state image sensing device in a fourth embodiment of the present invention.

FIG. 23 is a plan view illustrating the structure of a solid-state image sensing device in a fourth embodiment of the present invention. The solid-state image sensing device in the fourth embodiment includes first and second contact pads 43 and 44 which are respectively used to externally receive clock signals from first and second clock driver circuits 41 and 42 that are connected with a timing generator 40.

In the operation of the solid-state image sensing device in a fourth embodiment, the first clock driver circuit 41 feeds a clock signal to the first contact pad 43, and the second clock driver circuit 42 feeds another clock signal to the second contact pad 44. The phases of the clock signals fed to the first and second contact pads 43 and 44 are reversed from each other.

The first contact pad 43 is connected with the second clock line 31 and the fourth clock signal line 33. One end of each of the second clock signal line 31 and the fourth clock signal line 33 is connected with the first contact pad 43 so that other portions thereof are separated from each other. In other words, the second clock signal line 31 and the fourth clock signal line 33 are branched from the first contact pad 43. Correspondingly, one end of each of the first clock signal line 32 and the third clock signal line 34 is connected with the second contact pad 44 so that other portions thereof are separated from each other. In other words, the first clock signal line 32 and the third clock signal line 34 are branched from the second contact pad 44.

As is the case in the first to third embodiments, the second clock signal line 31 is used to feed the second clock signal Φ2 to the second transfer electrode pairs 3 (each including barrier and storage electrodes 3-1 and 3-2) in the main CCD region 1-1, and the fourth clock signal line 33 is used to feed the fourth clock signal Φ2L to the fourth transfer electrode pairs 5 (each including barrier and storage electrodes 5-1 and 5-2) in the output region 1-2. Correspondingly, the first clock signal line 32 is used to feed the first clock signal Φ1 the first transfer electrode pairs 4 in the main CCD region 1-1, and the third clock signal line 34 is used to feed the third clock signal Φ1L to the third transfer electrode pairs 6 in the output region 1-2.

As shown in FIG. 23, the numbers of the fourth and third transfer electrodes pairs 5 and 6 connected with the fourth and third clock signal lines 33 and 34 are smaller than those of the second and first transfer electrode pairs 3 and 4 connected with the second and first clock signal lines 31 and 32.

Therefore, the parasitic capacitances of the fourth and third clock signal lines 33 and 34 are smaller than those of the second and first clock signal lines 31 and 32. This effectively suppresses the waveform distortion of the clock signals fed to the transfer electrode pairs 5 and 6 within the output region 1-2, compared to the case that a pair of common clock lines is used to feed a pair of clock signals over the CCD 1. The above-described architecture in this embodiment effectively achieves high-speed charge transmission with a reduced number of clock buffers.

Fifth Embodiment

FIG. 24 is a plan view illustrating the structure of a solid-state image sensing device in a fifth embodiment of the present invention. The solid-state image sensing device in the fifth embodiment includes first and second contact pads 43 and 44 which are respectively used to externally receive clock signals from first and second clock driver circuits 41 and 42 that are connected with a timing generator 40.

In the operation of the solid-state image sensing device in a fourth embodiment, the first clock driver circuit 41 feeds a clock signal to the first contact pad 43, and the second clock driver circuit 42 feeds another clock signal to the second contact pad 44. The phases of the clock signals fed to the first and second contact pads 43 and 44 are reversed from each other.

The first contact pad 43 is connected with a connection node N3 which is connected with the second clock line 31 and the fourth clock signal line 33. One end of each of the second clock line 31 and the fourth clock signal line 33 is connected with the connection node N3, and other portions thereof are separated from one another. In other words, the second clock line 31 and the fourth clock signal line 33 are branched from the connection node N3.

Correspondingly, the second contact pad 44 is connected with a connection node N4 which is connected with the first clock line 32 and the third clock signal line 34. One end of each of the first clock line 32 and the third clock signal line 34 is connected with the connection node N4, and other portions thereof are separated from one another. In other words, the first clock line 32 and the third clock signal line 34 are branched from the connection node N4.

As is the case in the first to fourth embodiments, the second clock signal line 31 is used to feed the second clock signal Φ2 to the second transfer electrode pairs 3 in the main CCD region 1-1, and the first clock signal line 32 is used to feed the first clock signal Φ1 to the first transfer electrode pairs 4 in the main CCD region 1-1. Additionally, the fourth clock signal line 33 is used to feed the fourth clock signal Φ2L to the second transfer electrode pairs 3 in the output region 1-2, and the third clock signal line 34 is used to feed the third clock signal Φ1L to the third transfer electrode pairs 6 in the output region 1-2.

As shown in FIG. 24, the number of the fourth transfer electrodes pairs 5 connected with the fourth clock signal lines 33 is smaller than that of the second transfer electrode pairs 3 connected with the second clock signal lines 31. Therefore, the parasitic capacitance of the fourth clock signal line 33 is smaller than that of the second clock signal line 31. Correspondingly, the number of the third transfer electrodes pairs 3 connected with the third clock signal lines 34 is smaller than that of the first transfer electrode pairs 4 connected with the first clock signal lines 32. Therefore, the parasitic capacitance of the third clock signal line 34 is smaller than that of the first clock signal line 32. Such architecture allows reducing the waveform deformation of the clock signals fed to the transfer electrode pairs 5 and 6 in the output region 1-2.

It is apparent that the present invention is not limited to the above-described embodiments, which may be modified and changed without departing from the scope of the invention. It should be especially noted that the above-described embodiments may be combined if it does not cause any contradiction in the structure nor operation.

What is claimed is:

1. A charge coupled device, comprising:
    an output gate;
    a main CCD region operated in response to a set of clock signals; and
    an output region positioned between said output gate and said main CCD region and designed to transfer electric charges received from said main CCD region to said output gate;
    wherein said main CCD region includes first and second transfer electrodes and receiving said set of clock signals, and said output region includes third and fourth transfer electrodes receiving clock signals which are phase-reversed from each other,
    wherein charge transfer channel lengths corresponding to said output region are longer than charge transfer channel lengths corresponding to said main CCD region, and
    wherein said set of clock signals received by said first and second transfer electrodes and said clock signals received by said third and fourth transfer electrodes are outputted from different driver circuits.

2. The charge coupled device according to claim 1, wherein said set of clock signals received by said first and second transfer electrodes include:
    a first clock signal; and
    a second clock signal which is phase-reversed from said first clock signal,
    wherein said clock signals received by said third and fourth transfer electrodes include:
    a third clock signal having the same cycle period as said first clock signal; and
    a fourth clock signal having the same cycle period as said second clock signal.

3. The charge coupled device according to claim 2, further comprising:
    a first clock signal line feeding said first clock signal to said main CCD region;
    a second clock signal line feeding said second clock signal to said main CCD region;
    a third clock signal line provided separately from said first and second clock signal lines and feeding said third clock signal to said fourth transfer electrode; and
    a fourth clock signal line provided separately from said first and second clock signal lines and feeding said fourth clock signal to said third transfer electrode;
    wherein said third clock signal line is connected with said fourth transfer electrode without being connected with said main CCD region, and
    wherein said fourth clock signal line is connected with said third transfer electrode without being connected with said main CCD region.

4. The charge coupled device according to claim 1, wherein said third and fourth transfer electrodes are positioned adjacent to each other, and wherein one of said third and fourth transfer electrodes are positioned adjacent to said output gate.

5. The charge coupled device according to claim 4, further comprising:
    a fifth transfer electrode connected between said output gate and said one of said third and fourth transfer electrodes,
    wherein said fifth transfer electrode receives a fifth clock signal having a cycle period identical to an integral multiple of a cycle period of said third clock signal.

6. The charge coupled device according to claim 4, wherein frequencies of said first to fourth clock signals are changeable.

7. The charge coupled device according to claim 1, further comprising:
    a charge transfer diffusion layer through which said electric charges are transferred within said main CCD region and said output region,
    wherein said charge transfer diffusion layer is tapered down toward said output gate in said output region, and
    wherein lengths of said third and fourth transfer electrodes are increased as the decrease in a width of said charge transfer diffusion layer.

8. The charge coupled device according to claim 1, wherein lengths of said third and fourth transfer electrodes are longer than lengths of said first and second transfer electrodes.

9. The charge coupled device according to claim 8, wherein charge transfer channels corresponding to said main CCD region and said output region are disposed within an N-well having a constant width within said main CCD region and a reducing width within said output region.

10. The charge coupled device according to claim 1, wherein a total number of said third and fourth transfer electrodes is smaller than a total number of said first and second transfer electrodes.

11. A solid-state image sensing device, comprising;
    an output gate;
    a main CCD region including first and second transfer electrodes;
    an output region positioned between said output gate and said main CCD region and designed to transfer electric charges received from said main CCD region to said output gate, said output region including third and fourth transfer electrodes;
    a first contact pad;
    a second contact pad;
    second and fourth clock signal lines connected with said first contact pad; and
    first and third clock signal lines connected with said second contact pad,
    wherein said first clock signal line feeds a first clock signal to said first transfer electrodes;
    wherein said second clock signal line feeds a second clock signal to said second transfer electrodes;
    wherein said third clock signal line feeds a third clock signal to said third transfer electrode(s);
    wherein said fourth clock signal line feeds said fourth clock signal to said fourth transfer electrode(s), and
    wherein charge transfer channel lengths corresponding to said output region are longer than charge transfer channel lengths corresponding to said main CCD region.

12. The solid-state image sensing device according to claim 11, wherein a number of said third transfer electrode(s)

connected with said third clock signal line is less than that of said first transfer electrodes connected with said first clock signal line.

13. The solid-state image sensing device according to claim 12, wherein a number of said fourth transfer electrode(s) connected with said fourth clock signal line is less than that of said second transfer electrodes connected with said second clock signal line.

14. The solid-state image sensing device according to claim 11, wherein said second and fourth clock signal lines are separated from each other at portions other than said first contact pad.

15. The solid-state image sensing device according to claim 14, wherein said first and third clock signal lines are separated from each other at portions other than said second contact pad.

16. The solid-state image sensing device according to claim 11, wherein said second and fourth clock signal lines are branched from said first contact pad.

17. The solid-state image sensing device according to claim 16, wherein said first and third clock signal lines are branched from said second contact pad.

18. The solid-state image sensing device according to claim 11, further comprising:
   a first node connected to said first contact pad; and
   a second node connected to said second contact pad,
   wherein said second and fourth clock signal lines each have an end connected with said first node,
   wherein said first and third clock signal lines each have an end connected with said second node.

19. The solid-state image sensing device according to claim 11, wherein lengths of said third transfer electrodes and said fourth transfer electrodes are longer than lengths of said first and transfer electrodes and said second transfer electrodes.

20. The solid-state image sensing device according to claim 11, wherein a total number of said third transfer electrodes and said fourth transfer electrodes is smaller than a total number of said first transfer electrodes and said second transfer electrodes.

* * * * *